United States Patent
Sao et al.

(10) Patent No.: US 10,461,108 B2
(45) Date of Patent: Oct. 29, 2019

(54) IMAGING DEVICE

(71) Applicant: Hitachi, Ltd., Chiyoda-ku, Tokyo (JP)

(72) Inventors: Mayu Sao, Tokyo (JP); Yusuke Nakamura, Tokyo (JP); Kazuyuki Tajima, Tokyo (JP); Takeshi Shimano, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 15/836,017

(22) Filed: Dec. 8, 2017

(65) Prior Publication Data

US 2018/0166489 A1 Jun. 14, 2018

(30) Foreign Application Priority Data

Dec. 13, 2016 (JP) ................. 2016-240818

(51) Int. Cl.
*H01L 27/146* (2006.01)
*H04N 5/365* (2011.01)
*H04N 5/225* (2006.01)
*H04N 5/232* (2006.01)
*G02B 3/00* (2006.01)
*G02B 5/30* (2006.01)

(52) U.S. Cl.
CPC .......... *H01L 27/14627* (2013.01); *G02B 3/00* (2013.01); *G02B 5/30* (2013.01); *H01L 27/146* (2013.01); *H01L 27/14623* (2013.01); *H01L 27/14685* (2013.01); *H04N 5/2254* (2013.01); *H04N 5/365* (2013.01); *H04N 5/23229* (2013.01)

(58) Field of Classification Search
CPC .. H04N 5/2254; H04N 5/365; H04N 5/23229; H01L 27/14627; H01L 27/146; H01L 27/14685; H01L 27/14623
See application file for complete search history.

(56) References Cited

U.S. PATENT DOCUMENTS

| 2002/0089596 A1* | 7/2002 | Suda ................. H04N 3/1593 348/302 |
| 2004/0233275 A1* | 11/2004 | Tomita ............... G02B 27/0093 348/51 |
| 2006/0066743 A1* | 3/2006 | Onozawa ............. H04N 5/2253 348/340 |
| 2006/0285228 A1* | 12/2006 | Ishii ..................... G02B 5/1847 359/742 |

(Continued)

FOREIGN PATENT DOCUMENTS

JP 2011-203792 A 10/2011

*Primary Examiner* — Lin Ye
*Assistant Examiner* — John H Morehead, III
(74) *Attorney, Agent, or Firm* — Crowell & Moring LLP

(57) ABSTRACT

An imaging device includes: a modulator with a first pantoscopic grating pattern, which is configured to modulate light intensity by passage through the first pantoscopic grating pattern; an image sensor configured to convert light passing through the modulator, to image data, and output the image data; and an image processing unit configured to conduct image processing of restoring an image with the use of the image date output from the image sensor, and the imaging device is characterized in that: the first pantoscopic grating pattern is configured to include multiple basic patterns; and each of the basic patterns has the shape of a concentric circle.

9 Claims, 47 Drawing Sheets

(56) References Cited

U.S. PATENT DOCUMENTS

| | | | |
|---|---|---|---|
| 2007/0164329 A1* | 7/2007 | Toshikiyo | G02B 3/08 |
| | | | 257/291 |
| 2009/0250594 A1* | 10/2009 | Tanaka | G02B 5/201 |
| | | | 250/208.1 |
| 2011/0233383 A1 | 9/2011 | Oku | |
| 2015/0219808 A1* | 8/2015 | Gill | H04N 5/2254 |
| | | | 348/335 |

* cited by examiner

IMAGING DEVICE

CLAIM OF PRIORITY

This application claims the priority based on the Japanese Patent Application No. 2016-240818 filed on Dec. 13, 2016. The entire contents of which are incorporated herein by reference for all purpose.

BACKGROUND

Technical Field

The present invention relates to an imaging device.

Related Art

The related art in the present technical field includes JP 2011-203792 A (Patent Literature 1). This publication discloses an imaging device which achieves the reduction in size and thickness with the use of a microlens array.

SUMMARY

The technique disclosed in JP 2011-203792 A mentioned above provides an imaging method of "providing a microlens array at the previous stage and an aperture array to be opposed to each other, providing an aperture of the aperture array near the focal point of the microlens array at the previous stage for light from a subject, and furthermore, causing the light to converge at the same time with a microlens array at the subsequent stage", thereby "making it possible to make the optical system smaller, and thus achieve a small-size and thin finger vein authentication device". The foregoing imaging method limits the reduction in thickness in that: the use of the lenses requires a distance for light collection onto an image sensor; and requires the space for the arrangement of the two lens arrays.

An object of the present invention is to provide a technology related to a thin imaging device configured to reduce the operation quantity through easy signal processing, and expands the field of view in imaging at close range.

The present application encompasses more than one means for solving at least part of the problem mentioned above, and an example of the means will be given as follows. In order to solve the problem mentioned above, an imaging device according to an aspect of the present invention includes: a modulator with a first pantoscopic grating pattern, which is configured to modulate light intensity by passage through the first pantoscopic grating pattern; an image sensor configured to convert light passing through the modulator, to image data, and output the image data; and an image processing unit configured to conduct image processing of restoring an image with the use of the image date output from the image sensor, where the first pantoscopic grating pattern is configured to include multiple basic patterns, and each of the basic patterns has the shape of a concentric circle.

According to the present invention, a technology for a thin imaging device can be provided, which is configured to reduce the operation quantity through easy signal processing, and expands the field of view in imaging at close range. Objects, configurations, and advantageous effects other than the foregoing will be evident from the following description of an embodiment.

DETAILED DESCRIPTION

Figure 1:
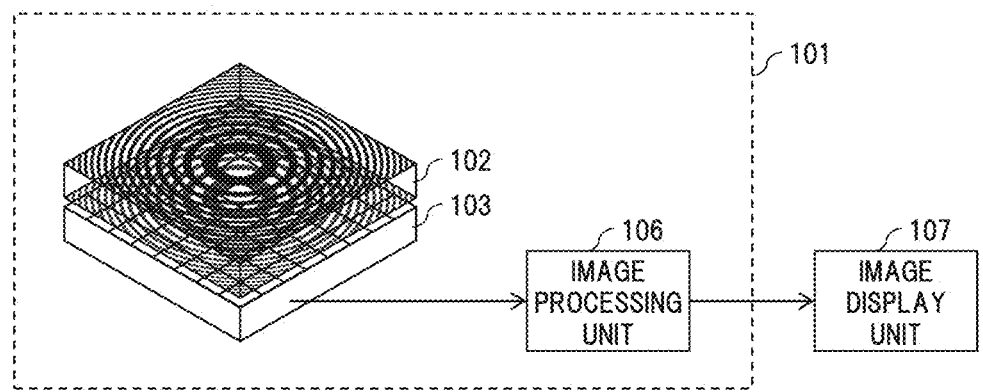
FIG. 1 is a diagram illustrating the configuration of an imaging device according to a first embodiment of the present invention.

In the following embodiments, explanations will be given which are divided into multiple sections or embodiments, if necessary, for the sake of convenience. However, unless expressly stated otherwise, the sections or embodiments are not to be considered independent of one another, but one section or embodiment has a relation partially or entirely with the other, such as modification examples, details, and supplemental explanations.

In addition, in the following embodiments, in the case of referring to the numbers (including numbers, numerical values, amounts, ranges, and the like) of elements, the numbers are not to be considered limited to any specific number, unless expressly stated otherwise, and unless obviously limited to the specific numbers in principle, but may be the specific numbers or more, or less.

Furthermore, in the following embodiments, obviously, the constituent elements (also including elemental steps) are not necessarily to be considered indispensable, unless expressly stated otherwise, and unless considered obviously indispensable in principle.

Likewise, in the following embodiments, in the case of referring to the shapes, positional relationship, and the like of the constituent elements, the shapes and the like are considered including equivalents substantially approximate or similar to the shapes and the like, unless expressly stated otherwise, and unless obviously excluded in principle. The same applies to the numerical values and ranges mentioned above.

In addition, throughout all of the drawings for the explanation of embodiments, the same members are denoted by the same reference numerals in principle, and repeated descriptions thereof will be omitted. Examples of the present invention will be described below with reference to the drawings.

In general, the reduction in thickness and the reduction in cost are often required for digital cameras mounted in information devices such as in-car cameras, wearable devices, and smartphones. For example, imaging methods have been proposed which achieve reductions in thickness and cost by obtaining object images without using any lens. Such techniques include an imaging method of attaching a special grating pattern in front of an image sensor, and solving an inverse problem for image development from a projection pattern received by the image sensor, thereby providing an image of an object. This method complicates the operation for solving the inverse problem through signal processing, thereby increasing the processing load, and thus making it harder to meet the hardware requirements specifications of information devices. The present invention aims at allowing reductions in thickness while keeping processing loads low.

<Principle of Shooting Object at Infinity> FIG. 1 is a diagram illustrating the configuration of an imaging device 101 according to a first embodiment of the present invention. The imaging device 101 is intended to acquire images of external objects without using any lens for imaging, and as shown in FIG. 1, composed of a modulator 102, an image sensor 103, and an image processing unit 106. In addition, the imaging device 101 is connected to an image display unit 107 including a display device or the like for displaying images, and information displayed on the image display unit 107 is controlled by the image processing unit 106.

Figure 2:
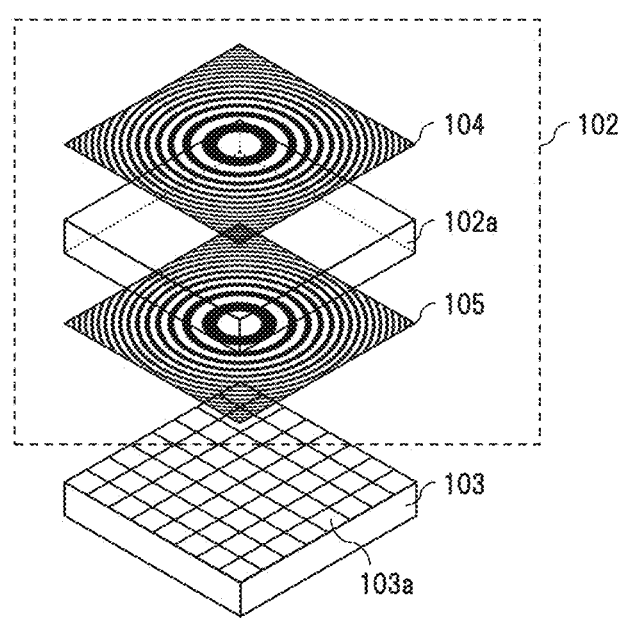
FIG. 2 is a diagram illustrating the configuration of a modulator according to the first embodiment.

FIG. 2 shows therein an example of the modulator 102. The modulator 102 is fixed in close contact with a light-receiving surface of the image sensor 103, and configured to have a first grating pattern 104 and a second grating pattern 105 each formed on a grid substrate 102a. The grid substrate 102a is composed of, for example, a transparent material such as glass or plastic. Hereinafter, the side of the grid substrate 102a closer to the image sensor 103 is referred to as a rear surface, whereas the opposed surface, that is, the side closer to an object of shooting is referred to as a surface.

The grating patterns 104, 105 are composed of concentric grating patterns that each have a grating pattern interval, that is, a pitch narrowed outwardly in inverse proportion to the radius from the center. The grating patterns 104, 105 are formed, for example, through vapor deposition of a metal such as aluminum or chromium by a sputtering method or the like for use in semiconductor processes. The pattern with the metal vapor-deposited and the pattern with nothing vapor-deposited provides a contrast. It is to be noted that the formation of the grating patterns 104, 105 is not to be considered limited thereto, but for example, the patterns may be formed with a contrast, for example, by printing or the like with an ink-jet printer or the like. Furthermore, while an explanation has been provided herein with visible light as an example, for example, in shooting with far-infrared rays, for the grid substrate 102a, any material that is transparent to a wavelength intended for shooting may be used, e.g., a material that is transparent to far-infrared rays such as germanium, silicon, or chalcogenide, and a blocking material such as a metal may be used for the grating patterns 104, 105.

Figure 3:
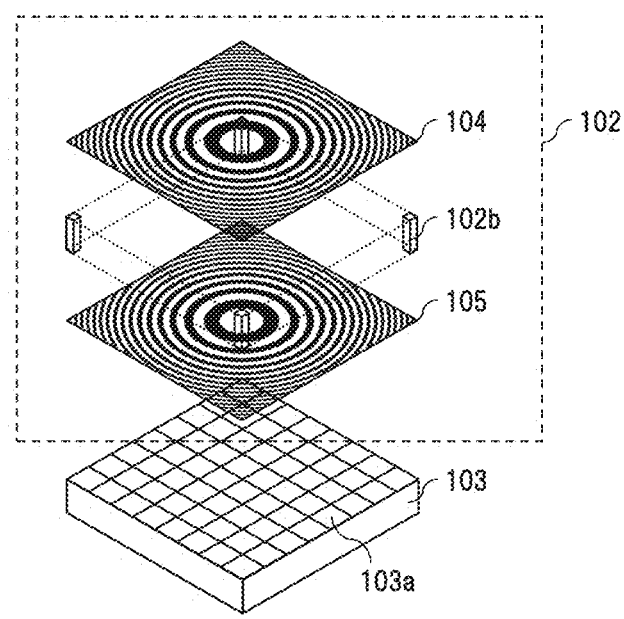
FIG. 3 is a diagram illustrating the configuration of another modulator according to the first embodiment.

It is to be noted that while a method of forming the grating patterns 104, 105 on the grid substrate 102a has been mentioned herein in order to achieve the modulator 102, the modulator 102 can be also achieved by, e.g., the grating patterns 104, 105 configured to be formed on thin films and held by supporting members 102b as shown in FIG. 3.

The intensity of light that passes through the grating patterns 104, 105 is modulated by the grating patterns, and the passing light is received by the image sensor 103. The image sensor 103 is composed of, for example, a CCD (Charge Coupled Device) image sensor or a CMOS (Complementary Metal Oxide Semiconductor) image sensor.

The surface of the image sensor 103 has pixels 103a as light-receiving elements arranged regularly in a grid-like form. This image sensor 103 converts optical images received by the pixels 103a to image signals as electrical signals. The image signals output from the image sensor 103 are subjected to image processing by the image processing unit 106 as an image processing unit, and output to the image display unit 107 or the like.

Figure 4:
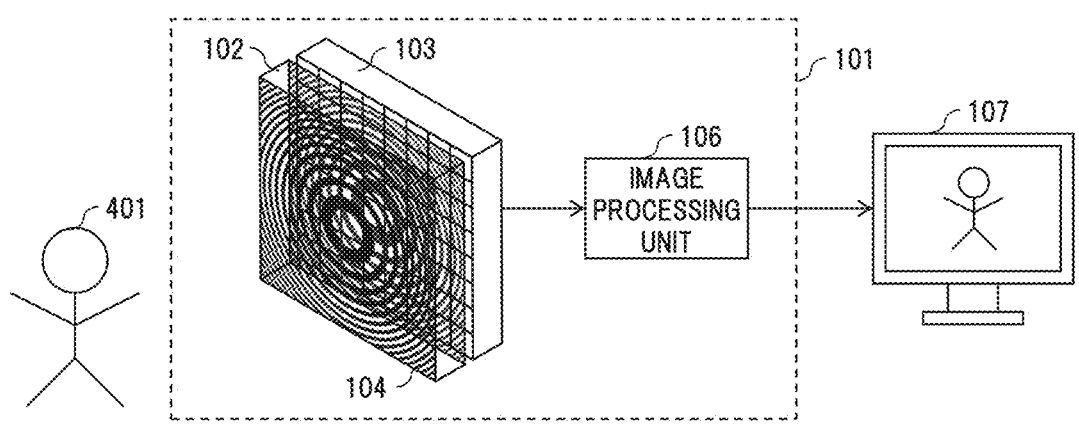
FIG. 4 is a diagram showing an example of shooting with the imaging device according to the first embodiment.

FIG. 4 is an explanatory diagram showing an example of shooting with the imaging device 101 in FIG. 1. FIG. 4 herein shows an example of shooting a subject 401 with the imaging device 101 and displaying the image on the image display unit 107. As shown, in shooting the subject 401, an image is taken in such a way that the surface of the modulator 102, specifically, the face of the grid substrate 102a with the first grating pattern 104 formed, is opposed to the subject 401.

Figure 5:
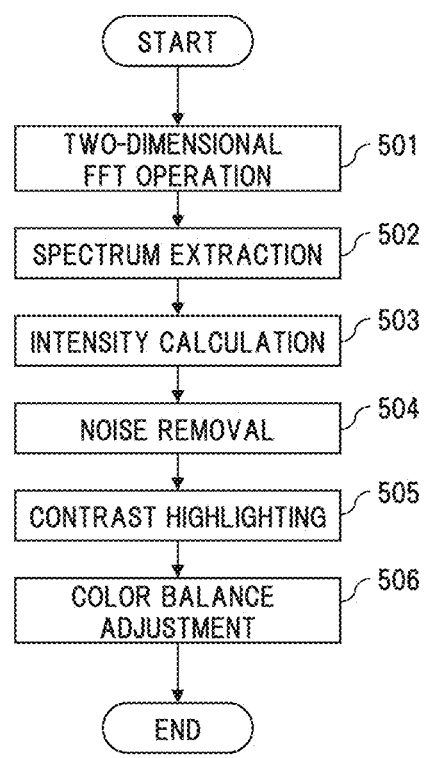
FIG. 5 is a diagram showing an example of an imaging flow according to the first embodiment.

Subsequently, an overview of image processing conducted by the image processing unit 106 will be described. FIG. 5 is a flowchart showing an overview of image processing executed by the image processing unit 106 included in the imaging device 101 in FIG. 1.

First, a moire fringe image output from the image sensor 103 is subjected to development processing through two-dimensional Fourier transform operation such as fast Fourier transform (FFT: Fast Fourier Transform) for each of RGB (Red, Green, Blue) color components, thereby providing a frequency spectrum (501). Subsequently, an image is acquired by extracting data in the required frequency domain from the frequency spectrum obtained through the processing in the step 501 (502), and then calculating the intensity of the frequency spectrum (503). Then, the image acquired is subjected to noise removal processing (504), and subsequently, to contrast highlighting processing (505) or the like. Thereafter, the image is subjected to a color balance adjustment (506), and output as a shot image. The foregoing completes the image processing executed by the image processing unit 106.

Subsequently, the principle of shooting in the imaging device 101 will be described. First, the concentric grating patterns 104, 105 with pitches narrowed in inverse proportion to the radiuses from the centers will be defined as follows. Assume a case of interference between a spherical wave close to a plane wave and a plane wave for use as reference light in a laser interferometer or the like. When the radius from the reference coordinate as the center of the concentric circle is denoted by r, and in that regard, the phase of a spherical wave is denoted by $\phi(r)$, the phase "$\phi(r)$" can be expressed by the following formula 1 with the use of a coefficient $\beta$ that determines the magnitude of a wavefront curvature:

[Mathematical Formula 1]

$$\phi(r) = \beta r^2 \qquad \text{Formula 1}$$

In spite of the spherical wave, the expression with the square of the radius r is adopted because approximation is possible only with the lowest order of the expansion owing to the spherical wave close to a plane wave. The interference of a plane wave to the light with the foregoing phase distribution provides an intensity distribution of interference fringe as expressed by the following formula 2:

[Mathematical Formula 2]

$$I(r) = \frac{1}{4}|\exp i\phi(r) + 1|^2 = \frac{1}{2}(1+\cos\phi) = \frac{1}{2}(1+\cos\beta r^2) \qquad \text{Formula 2}$$

This means a concentric fringe with a bright line, in the location of a radius that meets the following formula 3:

[Mathematical Formula 3]

$$\phi(r) = \beta r^2 = 2n\pi \; (n=0,1,2,\ldots) \qquad \text{Formula 3}$$

When the pitch of the fringe is denoted by p, the following formula 4 is obtained:

[Mathematical Formula 4]

$$p\frac{d}{dr}\phi(r) = 2p\beta r = 2\pi, \; p(r) = \frac{\pi}{\beta r} \qquad \text{Formula 4}$$

It is determined that the pitch is narrowed in inverse proportion to the radius. The plate with such a fringe is referred to as Fresnel Zone Plate or Gabor Zone Plate. Grating patterns with transmission distributions in proportion to the intensity distribution defined by the formula 2 are used as the grating patterns 104, 105 shown in FIG. 1.

Figure 6:
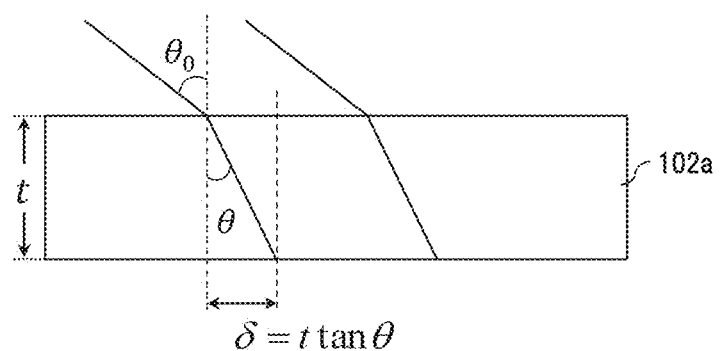
FIG. 6 is a diagram showing an example of an in-plane shift produced by a projection image of obliquely incident parallel light from the surface of a grid substrate to the rear surface thereof.

Assume that parallel light enters, at an angle $\theta_0$ as shown in FIG. 6, the modulator 102 of t in thickness with the foregoing grating patterns formed on both sides. When the refraction angle in the modulator 102 is denoted by $\theta$, light multiplied by the transmission of the grating at the surface enters, just with a shift of $\delta = t \cdot \tan \theta$, the rear surface in a geometric optical manner, and if the two concentric gratings are formed so as to align the centers of the gratings, then the light will be multiplied by the transmission of the grating at the rear surface with a shift of δ. In this case, the following intensity distribution is obtained.

[Mathematical Formula 5]

$$I(x, y)I(x+\delta, y) = \frac{1}{4}[1+\cos\beta(x^2+y^2)][1+\cos\beta((x+\delta)^2+y^2)] =$$
$$\frac{1}{8}[2 + 4\cos\beta(r^2+\delta x)\cos\delta\beta x + \cos 2\beta(r^2+\delta x) + \cos 2\delta\beta x]$$

Formula 5

It is determined that the fourth term of the expansion formula creates, over the entire overlapping region, equally spaced fringe patterns that are straight in the direction of the shift between the two gratings. The fringe generated at a relatively low spatial frequency by overlapping between the foregoing fringes is referred to as a moire fringe. The equally spaced fringes that are straight in this manner produce a sharp peak in a spatial frequency distribution obtained by two-dimensional Fourier transform of a detected image. It becomes possible to obtain, from the value of the frequency, the value of δ, that is, the incidence angle θ of a light beam. It is clear from the symmetry of the concentric grating configuration that such moire fringes obtained uniformly at equal spaces over the entire surface are generated at the same pitch regardless of the direction of the shift. Such fringes are obtained due to the formation of the grating patterns from Fresnel Zone Plate or Gabor Zone Plate, but any grating pattern may be used as long as moire fringes are obtained uniformly at equal spaces over the entire surface.

In this regard, when only a component with a sharp peak is extracted from the formula 5 as follows:

[Mathematical Formula 6]

$$M(x, y) = \frac{1}{8}(2 + \cos 2\delta\beta x)$$

Formula 6

The Fourier spectrum is expressed as follows:

[Mathematical Formula 7]

$$\mathcal{F}[M(x, y)] = \frac{1}{8}\mathcal{F}[2 + \cos 2\delta\beta x]$$
$$= \frac{1}{4}\delta(u, v) + \frac{1}{8}\delta\left(u + \frac{\delta\beta}{\pi}, v\right) + \frac{1}{8}\delta\left(u - \frac{\delta\beta}{\pi}, v\right)$$

Formula 7

In this case, F represents an operation for Fourier transform, u and v respectively represent spatial frequency coordinates in the x direction and in the y direction, and δ with brackets represents a delta function. From this result, it is determined that the spatial frequency of the moire fringe has peaks produced at the positions of u=±δβ/π in the spatial frequency spectrum of the detected image.

Figure 7:
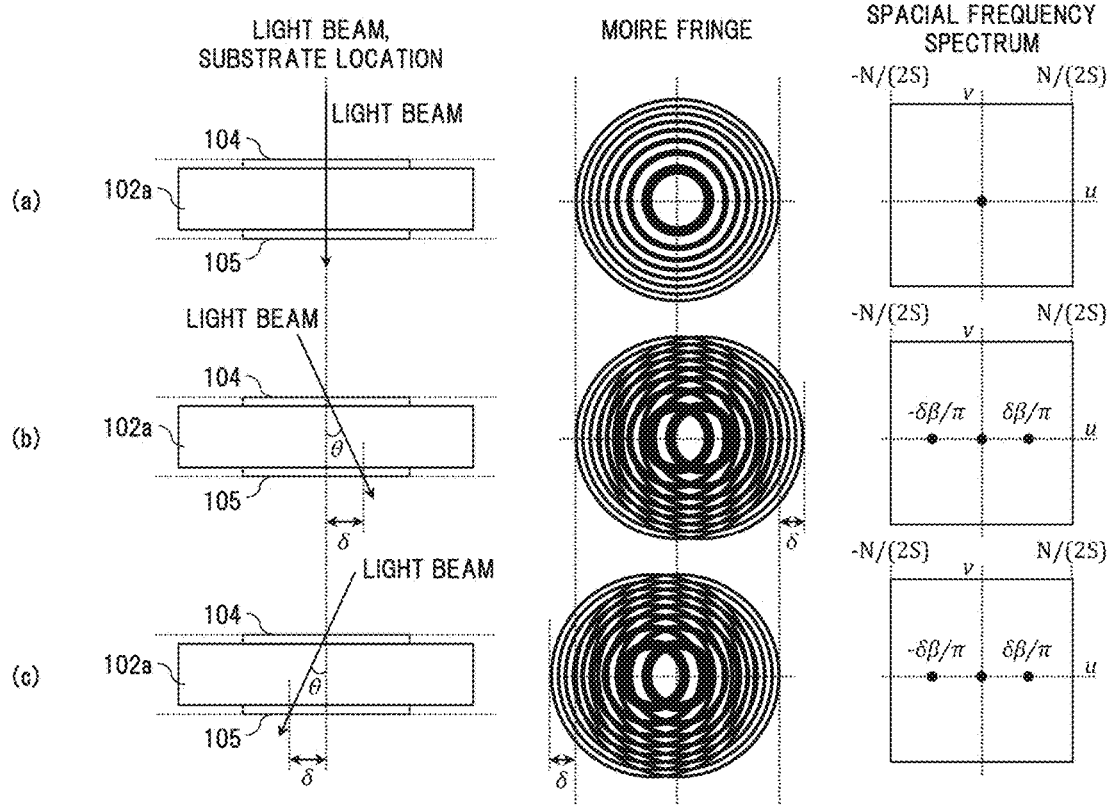
FIG. 7 is a diagram showing examples of the moire fringe generation and frequency spectrum in the case of aligned axes of gratings on both surfaces of a grid substrate (incidence angle: zero, +θ, −θ)

The appearance is shown in FIG. 7. In FIG. 7, respective pattern diagrams of: the arrangement of a light beam and the modulator 102; moire fringes; and spatial frequency spectra are shown from left to right. FIG. 7 respectively shows: a case of normal incidence; a case of light beam incidence at an angle θ from the left side; and a case of light beam incidence at an angle θ from the right side.

The first grating pattern 104 formed at the surface of the modulator 102 and the second grating pattern 105 formed at the rear surface of the first grating pattern 104 have axes aligned. In FIG. 7(a), no moire fringe is produced because the first grating pattern 104 and the second grating pattern 105 have shadows matched.

In FIGS. 7(b) and (c), the same moire is produced because the shift is equal between the first grating pattern 104 and the second grating pattern 105, while the spatial frequency spectra also have peak positions matched, thus making it impossible to determine whether the incidence angle of the light beam corresponds to the case in FIG. 7(b) or the case in FIG. 7(c).

Figure 8:
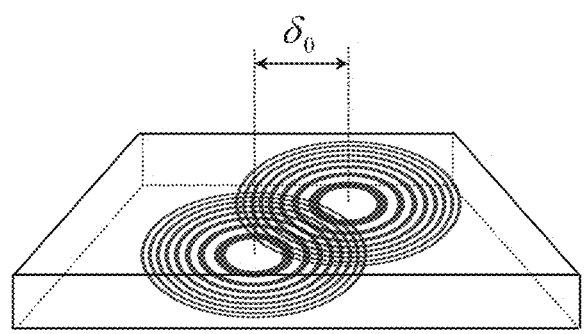
FIG. 8 is a diagram showing an example of disposing a surface grating and a rear surface grating, with a shift between the axes of the gratings.

In order to avoid this situation, for example, as shown in FIG. 8, there is a need to relatively shift the two grating patterns 104, 105 in advance with respect to the optical axis such that the shadows of the two grating patterns have an overlap with a shift even with respect to a light beam that vertically enters the modulator 102. When a relative shift between the shadows of the two gratings with respect to a vertically incident plane wave on the axis is denoted by $\delta_0$, the shift δ generated by a plane wave at the incidence angle θ can be expressed as follow:

[Mathematical Formula 8]

$$\delta = \delta_0 + t\tan\theta$$

Formula 8

Formula 8

In this case, the spatial frequency spectrum of a moire fringe from a light beam at the incidence angle θ has, on the higher side of the frequency, a peak at the following position:

[Mathematical Formula 9]

$$u = \frac{\delta\beta}{\pi} = \frac{1}{\pi}(\delta_0 + t\tan\theta)\beta$$

Formula 9

When the size of the image sensor is denoted by S, and when the numbers of pixels of the image sensor in the x direction and the y direction are both denoted by N, the spatial frequency spectrum of a discrete image obtained by two-dimensional Fourier transform is obtained in the range from −N/(2S) to +N/(2S). From the foregoing, considering evenly receiving light at a plus incidence angle and a minus incidence angle, it is appropriate to regard the spectrum peak position of a moire fringe from a vertically incident plane wave (θ=0) as a middle position between the origin (DC: direct-current component) position and, for example, a frequency position at the + sided end, that is, the following spatial frequency position:

[Mathematical Formula 10]

$$\frac{\delta_0\beta}{\pi} = \frac{N}{4S}$$

Formula 10

Therefore, it is appropriate to regard the relative center position shift between the two gratings as follows:

[Mathematical Formula 11]

$$\delta_0 = \frac{\pi N}{4\beta S}$$

Formula 11

Figure 9:
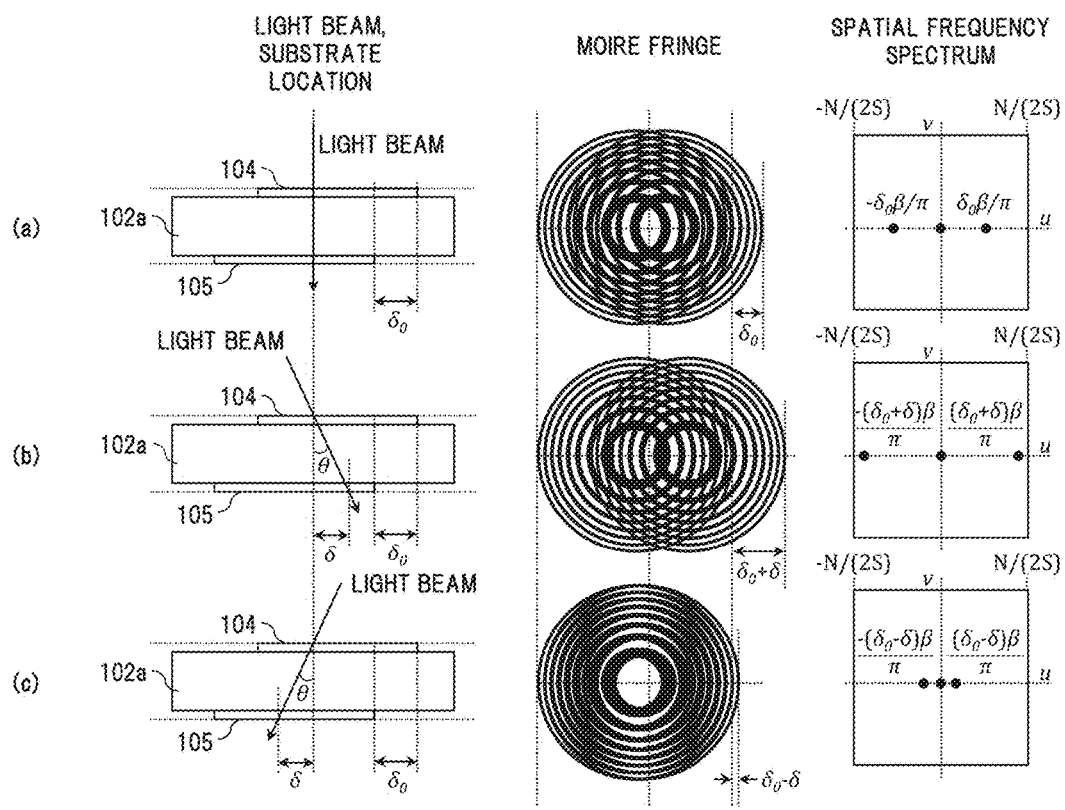
FIG. 9 is a diagram showing examples of the moire fringe generation and frequency spectrum in the case of shifted gratings on both surfaces of a grid substrate (incidence angle: zero, +θ, −θ)

FIG. 9 is a pattern diagram for explaining the moire fringe generation and the frequency spectra in the case of the first grating pattern 104 and the second grating pattern 105 arranged with a shift. As with FIG. 7, the left side, the center column, and the right side respectively show: the arrangement of a light beam and the modulator 102; moire fringes; and spatial frequency spectra. In addition, FIG. 9 respectively corresponds to: a case of normal light beam incidence; a case of light beam incidence at an angle θ from the left side, and a case of light beam incidence at an angle θ from the right side.

The first grating pattern 104 and the second grating pattern 105 are arranged in advance with a shift $\delta_0$. Therefore, even in FIG. 9(*a*), a moire fringe is produced, and peaks appear in the spatial frequency spectrum. The shift amount $\delta_0$ is set such that the peak positions each appear in the center of the spectrum range on one side from the origin as mentioned above. In this case, the shift δ is further increased in FIG. 9(*b*), whereas the shift δ is decreased in FIG. 9(*c*), and thus, unlike FIGS. 7(*b*) and 7(*c*), the difference between FIGS. 9(*b*) and 9(*c*) can be determined from the peak positions of the spectra. The spectral image with the peaks corresponds to, more specifically, a bright spot indicating a light flux at infinity, which is nothing more or less than an image shot by the imaging device 101 in FIG. 1.

When the maximum angle of the incidence angle of parallel light that can be received is denoted by $\delta_{max}$, the following formula 12 is satisfied:

[Mathematical Formula 12]

$$u_{max} = \frac{1}{\pi}(\delta_0 + t\tan\theta_{max})\beta = \frac{N}{2S} \quad \text{Formula 12}$$

Thus, the maximum angle of view for light that can be received by the imaging device 101 is given by the following formula 13:

[Mathematical Formula 13]

$$\tan\theta_{max} = \frac{\pi N}{4T\beta s} \quad \text{Formula 13}$$

Analogically with imaging through the use of a common lens, when parallel light with the angle of view $\theta_{max}$ is considered focused on the end of the image sensor and received, the effective focal length of the imaging device 101 without the use of any lens can be considered corresponding to the following formula 14:

[Mathematical Formula 14]

$$f_{eff} = \frac{S}{2\tan\theta_{max}} = \frac{2t\beta S^2}{\pi N} \quad \text{Formula 14}$$

In this regard, it is determined from the formula 13 that it is possible to change the angle of view depending on the thickness t of the modulator 102 and the coefficient β of the grating patterns 104, 105. Therefore, for example, as long as the modulator 102 has the configuration in FIG. 3, and has the function of being capable of changing the length of the supporting members 102*b*, it also becomes possible do the shooting with the angle of view changed during the shooting.

It is to be noted that while the fast Fourier transform as an example has been described as a method for calculating a spatial frequency spectrum from a moire fringe, without limitation thereto, it is possible to achieve the method even with the use of discrete cosine transform (DCT: Discrete Cosine Transform) or the like, thereby also making it possible to further reduce the operation quantity.

Figure 10:
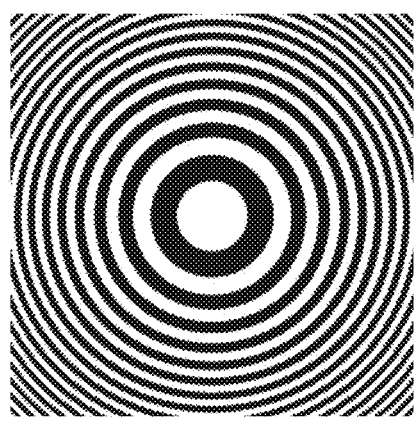
FIG. 10 is a diagram showing an example of a grating pattern.
Figure 11:
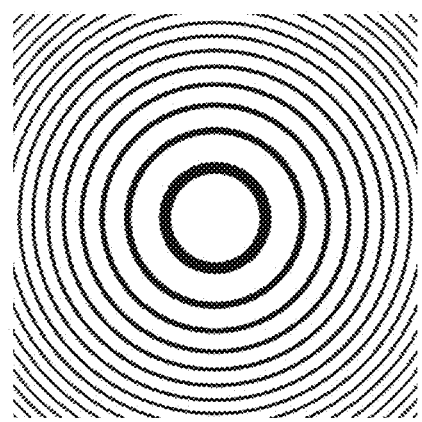
FIG. 11 is a diagram showing another example of a grating pattern.

In addition, the transmission distributions of the grating patterns 104, 105 have been described with the assumption that the distributions have sinusoidal characteristics as represented by the formula 2, but have only to include such components as fundamental frequency components for grating patterns, and for example, as shown in FIG. 10, it is also possible to binarize the transmissions of the grating patterns, and furthermore, as in FIG. 11, it is also conceivable that changing the duty ratio between high-transmission and low-transmission grating regions increases the width of the high-transmission region, thereby increasing the transmission thereof. Thus, effects such as suppressed diffraction from the grating patterns are also obtained, thereby making it possible to reduce deterioration of shot images.

Figure 12:
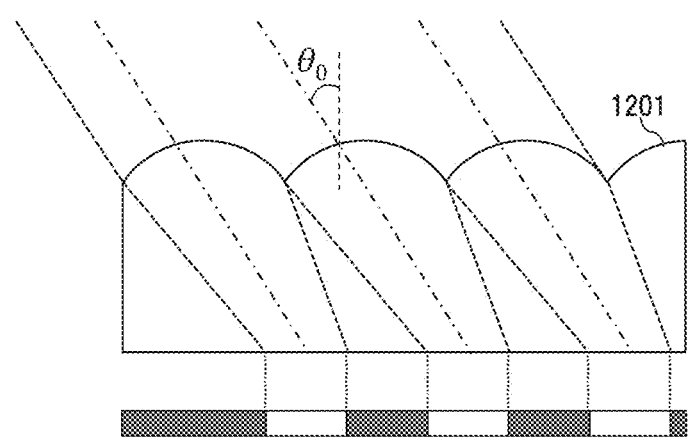
FIG. 12 is a diagram showing yet another example of a grating pattern.

In addition, the grating patterns 104, 105 may be achieved by phase modulation, rather than transmission modulation. For example, the replacement of the grid substrate 102*a* by a cylindrical lens 1201 as shown in FIG. 12 can generate an intensity modulation pattern as shown on the image sensor 103, thereby making it possible to achieve imaging as discussed previously. Thus, the light amount loss by the shielding part of the grating pattern 104 can be reduced, thereby improving the light use efficiency, and the effect of suppressing diffraction from the grating pattern is also obtained. While the pattern is achieved with a lens in FIG. 12, it is also possible to achieve the pattern with a phase modulation element that has an equivalent effect.

The incident light beams each has only one incidence angle at the same time in the foregoing description, but in order for the imaging device 101 to work actually as a camera, a case has to be assumed where light at multiple incidence angles enters the imaging device 101 at the same time. At a time when light at such multiple incidence angles enters the grating pattern at the rear surface, already multiple images of the surface grating will be superimposed on one another. If these images mutually moire fringes, there will be concern about the moire fringes leading to noises which interfere with the detection of a moire fringe with the second grating pattern 105 as a signal component. However, actually, the overlap between images of the first grating pattern 104 produce no moire image peak, and it is only the overlap with the second grating pattern 105 at the rear surface that produces a peak. The reason therefor will be described below.

First, it is a big difference that the overlaps between shadows of the first grating pattern 104 at the surface, obtained from light beams at multiple incidence angles, are obtained by finding a sum, rather than a product. In the case of an overlap between a shadow of the first grating pattern 104, obtained from light atone incidence angle, and the second grating pattern 105, the light intensity distribution for the shadow of the first grating pattern 104 is multiplied by the transmission of the second grating pattern 105, thereby providing the light intensity distribution after the passage through the second grating pattern 105 at the rear surface.

In contrast, the overlaps between shadows, obtained from light at multiple different incidence angles onto the first grating pattern 104 at the surface, correspond to light overlaps, which are thus obtained by finding the sum of the overlaps, rather than the product thereof. In the case of the sum, the distribution is obtained as follows:

[Mathematical Formula 15]

$$I(x, y) + I(x + \delta, y) = \frac{1}{2}[1 + \cos\beta(x^2 + y^2)] + \frac{1}{2}[1 + \cos\beta((x + \delta)^2 + y^2)]$$
$$= 1 + \cos[\beta(r^2 + \delta x)]\cos\delta\beta x$$

Formula 15 where the distribution for the original grating of Fresnel Zone Plate is multiplied by the distribution of the moire fringe. Accordingly, the frequency spectrum is expressed by the overlap integral of the respective frequency spectra. For this reason, even if the spectrum of moire has a single sharp peak, a ghost of the frequency spectrum for the Fresnel Zone Plate will be merely produced at the position of the peak in practice. More specifically, the spectrum has no sharp peak produced. Therefore, even when light at multiple incidence angles is allowed to enter, the spectrum of a moire image detected always has only moire obtained by the product of the first grating pattern 104 at the surface and the second grating pattern 105 at the rear surface, and as long as the second grating pattern 105 is single, the detected spectrum has only one peak for one incidence angle.

Figure 13:
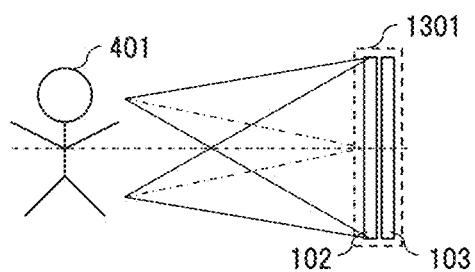
FIG. 13 is a diagram for explaining an angle made by light from each point constituting an object with respect to a sensor.

In this regard, the correspondence between such parallel light as described previously for detection and light from an actual object will be schematically described with reference to FIG. 13. FIG. 13 is an explanatory diagram for explaining an angle made by light from each point constituting an object with respect to an image sensor. Light from each point constituting a subject 401 enters, strictly as a spherical wave from a point light source, the modulator 102 and the image sensor 103 (hereinafter, referred to as a grating sensor integrated substrate 1301 in FIG. 13) in the imaging device 101 in FIG. 1. In this case, when the grating sensor integrated substrate is sufficiently small or sufficiently far away with respect to the subject 401, the incidence angle of light illuminating the grating sensor integrated substrate from each point can be regarded as the same angle.

From the relation where the spatial frequency displacement Δu of moire with respect to the microscopic angular displacement Δθ obtained from the formula 9 is equal to or less than 1/S as the minimum resolution for the spatial frequency of the image sensor, the conditions for regarding Δθ as parallel light can be expressed as follows:

[Mathematical Formula 16]

$$\Delta u = \frac{1}{\pi}\beta t\Delta\theta \leq \frac{1}{S}, \quad \Delta\theta \leq \frac{\pi}{S\beta t}$$

Formula 16

Figure 14:
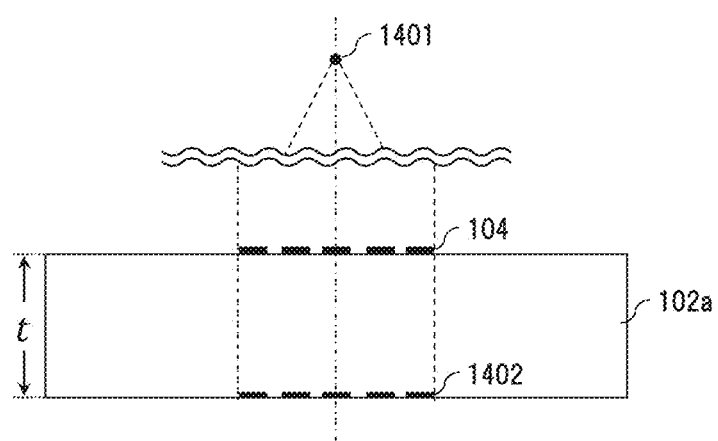
FIG. 14 is a diagram showing an example of a surface grating pattern projected in the case of an object located at an infinite distance.
Figure 15:
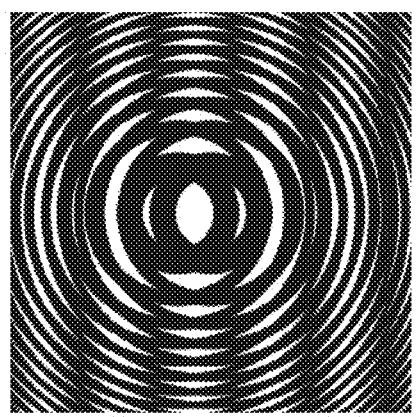
FIG. 15 is a diagram showing an example of a moire fringe generated in the case of an object located at an infinite distance.

Under this condition, the imaging device according to the present invention is capable of shooting objects at infinity. <Principle of Shooting Object at Finite Distance> In this regard, FIG. 14 shows therein a projection of the first grating pattern 104 at the surface onto the rear surface in the case at infinity as mentioned previously. Spherical waves from a point 1401 constituting the object at infinity turn into plane waves while sufficiently long-distance propagation, and irradiate the first grating pattern 104 at the surface, and when the projection image 1402 is projected onto the lower face, the projection image has almost the same shape as the first grating pattern 104. As a result, the projection image 1402 is multiplied by the transmission distribution of the grating pattern (corresponding to the second grating pattern 105 in FIG. 2) at the rear surface, thereby making it possible to obtain a moire fringe of equally spaced linear shapes (FIG. 15).

Figure 16:
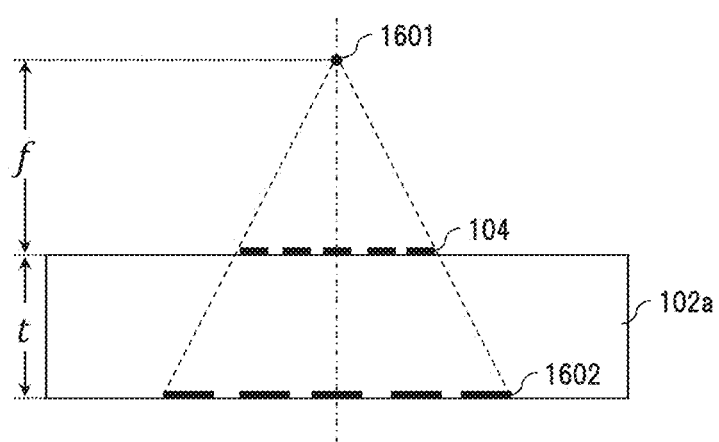
FIG. 16 is a diagram showing an example of a surface grating pattern enlarged in the case of an object located at a finite distance.

On the other hand, imaging of an object at a finite distance will be described. FIG. 16 is an explanatory diagram illustrating a more enlarged projection of the first grating pattern 104 at the surface onto the rear surface, as compared with the first grating pattern 104, in the case of an object of imaging located at a finite distance. As shown in FIG. 16, spherical waves from a point 1601 constituting the object irradiate the first grating pattern 104 at the surface, and when the projection image 1602 is projected onto the lower face, the projection image is enlarged almost with uniformity. It is to be noted that he enlargement factor α can be calculated as follows with the use of the distance f from the first grating pattern 104 to the point 1601.

[Mathematical Formula 17]

$$\alpha = \frac{f + t}{f}$$

Formula 17

Figure 17:
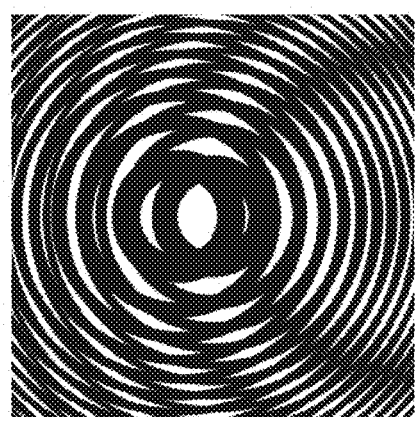
FIG. 17 is a diagram showing an example of a moire fringe generated in the case of an object located at a finite distance.
Figure 18:
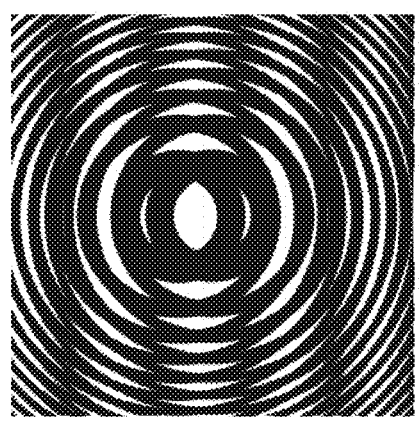
FIG. 18 is a diagram showing an example of a moire fringe obtained by a rear surface grating pattern corrected in the case of an object located at a finite distance.

Therefore, the multiplication directly by the transmission distribution of the grating pattern at the rear surface, which is designed for parallel light, eliminate the generation of any moire fringe of equally spaced linear shapes (FIG. 17). However, as long as the second grating pattern 105 is enlarged in accordance with the enlarged shadow of the first grating pattern 104 at the surface, which is enlarged with uniformity, the enlarged projection image 1602 can be again allowed to generate a moire fringe of equally spaced linear shapes (FIG. 18). To this end, it is possible to make a correction by adjusting the coefficient β of the second grating pattern 105 to β/α2.

Thus, light from the point 1601 which is not always located at infinity can be selectively subjected to development. Accordingly, shooting can be done by focusing on any position.

<Simplified Configuration> Next, a method for simplifying the configuration of the modulator 102 will be described. In the case of the modulator 102, the first grating pattern 104 and the second grating pattern 105 in the same configuration are formed with a shift between each other respectively on the surface and rear surface of the grid substrate 102a, thereby detecting the angle of incident parallel light from the spatial frequency spectrum of a moire fringe, for achieving image development. The second grating pattern 105 at the rear surface serves as an optical element that modulates the intensity of incident light in close contact with the image sensor 103, and has the same grating pattern regardless of incident light. Therefore, as shown in FIG. 19, through the use of a modulator 1901 with the second gating pattern 105 removed therefrom, the processing corresponding to the second grating pattern 105 may be executed by an intensity modulation unit 1903 in an image processing unit 1902.

Figure 20:
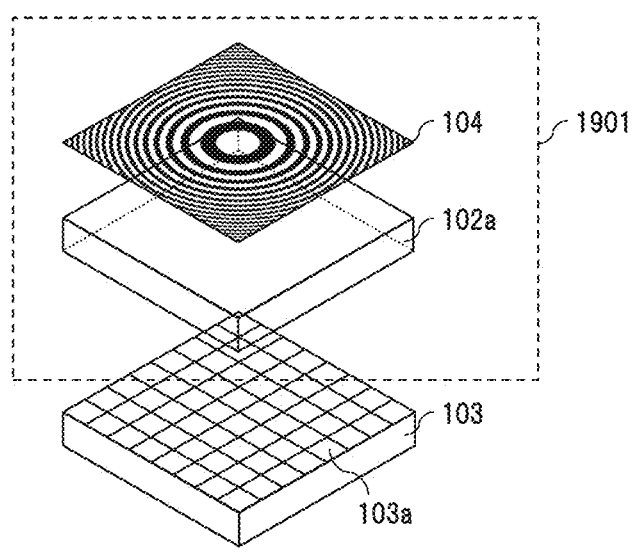
FIG. 20 is a diagram illustrating a modulator for replacing a rear surface grating pattern with image processing.

Details of the configuration of the modulator 1901 in this case are shown in FIG. 20. This configuration can reduce the number of grating patterns formed on the grid substrate 102a by one pattern. Thus, the manufacturing cost of the modulator can be reduced, and furthermore, the light use efficiency can be also improved.

Figure 19:
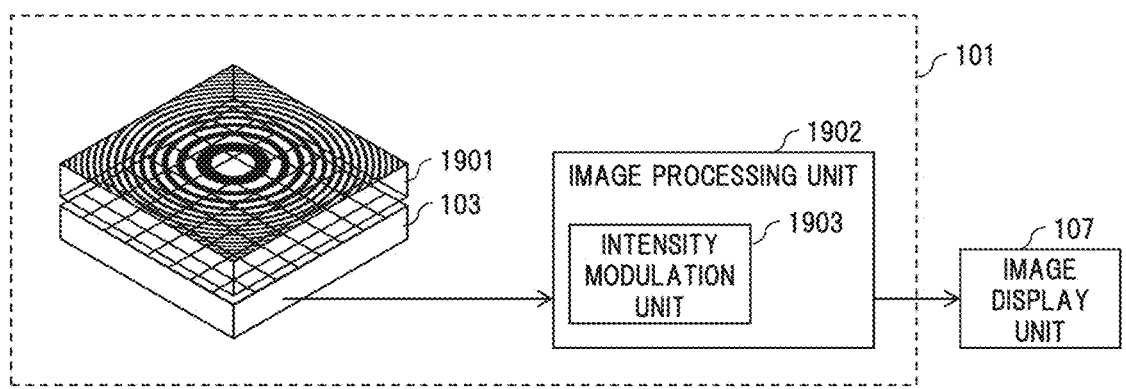
FIG. 19 is a diagram illustrating a modification example of replacing a rear surface grating pattern with image processing.
Figure 21:
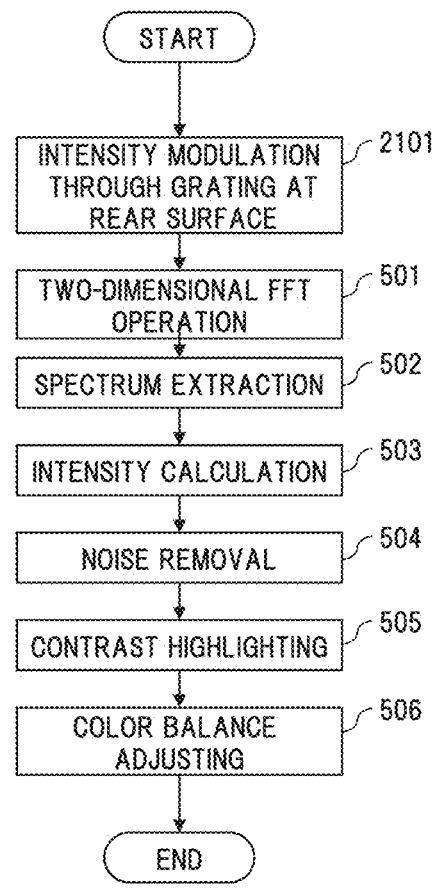
FIG. 21 is a diagram showing a processing flow for replacing a rear surface grating pattern with image processing.

FIG. 21 is a flowchart showing an overview of image processing conducted by the image processing unit 1902 in FIG. 19. The difference of the flowchart in FIG. 21 herein from the flowchart in FIG. 5 is processing in step 2101. In accordance with the processing in the step 2101, the intensity modulation unit 1903 described previously generates, with respect to an image output from the image sensor 103, a moire fringe image corresponding to the passage through the grating pattern 105 at the rear surface. Specifically, the operation corresponding to the formula 5 has only to be performed, and the image of the image sensor 103 may be thus multiplied by the grating pattern 105 at the rear surface, generated in the intensity modulation unit 1903. Furthermore, as long as the grating pattern 105 at the rear surface is a binarized pattern as shown in FIGS. 10 and 11, it is also possible to achieve the pattern just by setting the value of the image sensor 103 to 0 in the domain corresponding to black. Thus, it is possible to reduce the scale of the multiplication circuit. The subsequent processing in the steps 501 to 506 in FIG. 21 is configured in the same fashion as the processing in FIG. 5, and the description thereof will be omitted here.

It is to be noted that in this case, the pixels 103a of the image sensor 103 need to have a fine pitch to the extent that the pitch of the first grating pattern 104 can be reproduced adequately, or a course pitch to the extent that the pitch of the first grating pattern 104 can be reproduced by the pitch of the pixels 103a. In the case of forming the grating pattern on the both sides of the grid substrate 102a, it is not always necessary for the pitch of the grating pattern to be resolved successfully at the pixels 103a of the image sensor 103, but the moire image has only to be resolved successfully. However, in the case of reproducing the grating pattern by image processing, the resolution of the grating pattern needs to be equal to the resolution of the image sensor 103.

In addition, the processing corresponding to the second grating pattern 105 is achieved above by the intensity modulation unit 1903 as described above, but can be also achieved by setting the sensitivity of the sensor in an effective manner in consideration of the transmission of the second grating pattern 105, because the second grating pattern 105 serves as an optical element that modulates the intensity of incident light in close contact with the sensor. <Noise Cancellation> While the explanation has been given while focusing on the formula 6 obtained by the extraction of only the component with sharp peak from the formula 5 in the previous description, the terms of the formula 5 other than the fourth term cause noises in actuality. Therefore, noise cancellation based on fringe scan is effective.

First, in the interference fringe intensity distribution of the formula 2, when the initial phase of the first grating pattern 104 and the initial phase of the second grating pattern 105 are respectively denoted by $\phi_F$ and $\phi_B$, the formula 5 can be expressed as follows:

[Mathematical Formula 18]

$$I(x, y)I(x+\delta, y) = \frac{1}{4}\{1 + \cos[\beta(x^2 + y^2) + \Phi_B]\}\{1 + \cos[\beta((x+\delta)^2 + y^2) + \Phi_F]\} \quad \text{Formula 18}$$

In this regard, when the formula 18 is integrated with respect to the $\Phi_F$ and the $\Phi_B$ as follows through the use of the orthogonality of the trigonometric function,

[Mathematical Formula 19]

$$\int\int_0^{2\pi} I(x, y)I(x+\delta, y) \cdot \cos(\Phi_B - \Phi_F)d\Phi_B d\Phi_F = \frac{\pi^2}{4}\cos(2\beta\delta x + \beta\delta^2) \quad \text{Formula 19}$$

the single frequency term multiplied by a constant will be left with the noise terms cancelled. From the previous discussion, when this term is subjected to Fourier transform, a sharp peak without any noise will be produced in the spatial frequency distribution.

In this regard, the formula 19 is shown in the form of an integral equation, but in actuality, a similar effect is also achieved by calculating the sum in the combination of $\Phi_F$ and $\Phi_B$. The $\Phi_F$ and the $\Phi_B$ may be set so as to divide the angle of 0 to $2\pi$ equally, and divided equally into four such as $\{0, \pi/2, \pi, 3\pi/2\}$, or three, such as "$0, \pi/3, 2\pi/3$".

Furthermore, the formula 19 can be simplified. While calculations are made so that the $\Phi_F$ and the $\Phi_B$ are changed independently in accordance with the formula 19, the noise terms can be cancelled even with $\Phi_F = \Phi_B$, that is, when the same phase is applied to the initial phases of the grating patterns 104 and 105. The application of $\Phi F = \Phi B = \Phi$ in the formula 19 results in the following:

[Mathematical Formula 20]

$$\int_0^{2\pi} I(x, y)I(x+\delta, y)d\Phi = \frac{\pi}{4}[2 + \cos(2\beta\delta x + \beta\delta^2)] \quad \text{Formula 20}$$

the single frequency term multiplied by a constant will be left with the noise terms cancelled. In addition, the $\Phi$ may be set so as to divide the angle of 0 to $2\pi$ equally, and divided equally into four such as $\{0, \pi/2, \pi, 3\pi/2\}$.

Alternatively, without dividing equally, the noise terms can be also cancelled with the use of orthogonal phases of $\{0, \pi/2\}$, thereby achieving further simplification. First, as long as the second grating pattern 105 is achieved by the image processing unit 1902 as with the configuration in FIG. 19, negative values can be handled for the grating pattern 105, and thus, the formula 18 is expressed as follows ($\Phi_F = \Phi_B = \Phi$):

[Mathematical Formula 21]

$$I(x, y)I(x+\delta, y) = \frac{1}{4}\cos[\beta(x^2 + y^2) + \Phi]\{1 + \cos[\beta((x+\delta)^2 + y^2) + \Phi]\} \quad \text{Formula 21}$$

Because the grating pattern 105 is known, the subtraction of the grating pattern 105 from the formula 21 and the addition for the case of $\phi = \{0, \pi/2\}$ result in the following:

[Mathematical Formula 22]

$$[I(x, y)I(x+\delta, y) - I(x, y)]|_{\Phi=0} + [I(x, y)I(x+\delta, y) - I(x, y)]|_{\Phi=\frac{\pi}{2}} = \frac{1}{4}\cos(2\beta\delta x + \beta\delta^2) \quad \text{Formula 22}$$

The single frequency term multiplied by a constant will be left with the noise terms cancelled.

In addition, as described previously, the first grating pattern 104 and the second grating pattern 105 are shifted by $\delta_0$ in advance, thereby separating two developed images produced in the spatial frequency space. However, this method has the problem of reducing by half the numbers of pixels of the developed images. Therefore, a method of avoiding an overlap between developed images without shifting by $\delta_0$ will be described. In the fringe scan in accordance with the formula 19, the operation is performed on a complex plane with the use of an exponential term instead of the cosine term as follows:

[Mathematical Formula 23]

$$\int\int_0^{2\pi} I(x,y)I(x+\delta,y) \cdot e^{i(\Phi_B - \Phi_F)} d\Phi_B d\Phi_F = \frac{\pi^2}{4} e^{i(2\beta\delta x + \beta\delta^2)} \quad \text{Formula 23}$$

Thus, the single frequency term multiplied by a constant will be left with the noise terms cancelled. When the exp ($2i\beta\delta x$) in the formula 23 is subjected to Fourier transform, the following formula is obtained:

[Mathematical Formula 24]

$$\mathcal{F}_{[e^{i2\beta\delta x}]} = \delta(u+2\delta\beta, v) \quad \text{Formula 24}$$

It is determined that a single developed image is obtained without producing two peaks as in the formula 7. As just described, the need to shift the grating patterns 104, 105 is also eliminated, thereby making it possible to use the number of pixels effectively.

Configurations for implementing the foregoing noise cancellation method based on fringe scan will be described with reference to FIGS. 22 through 27. In accordance with the fringe scan, there is a need to use, at least as the grating pattern 104, multiple patterns that differ in initial phase. In order to achieve the multiple patterns, there are: a method of switching the patterns in a time-division manner; and a method of switching the patterns in a spatial-division manner.

Figure 22:
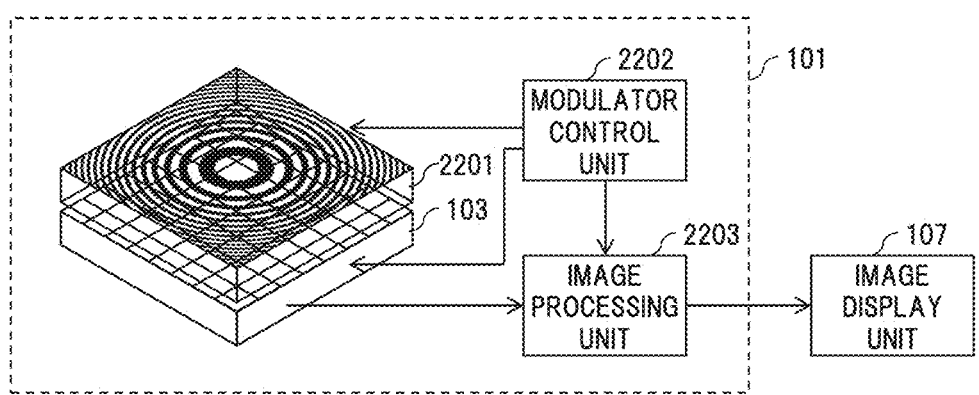
FIG. 22 is a diagram showing a modification example of time-division fringe scan.
Figure 23:
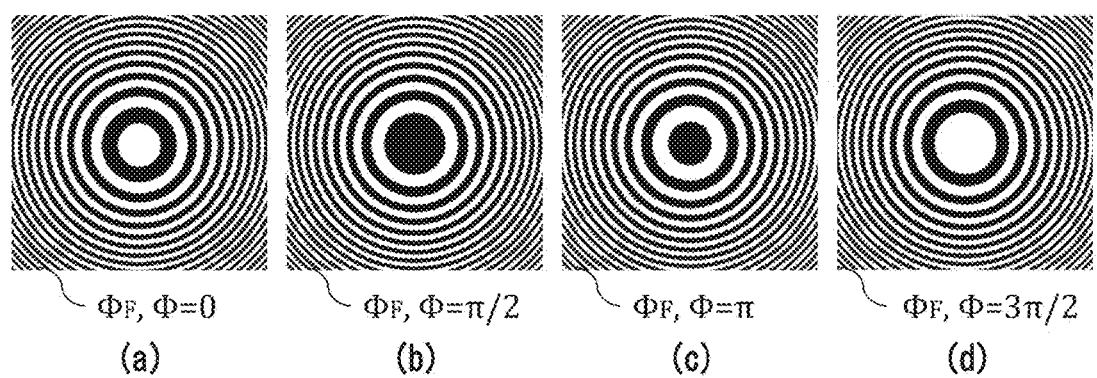
FIG. 23 is a diagram showing examples of grating patterns in time-division fringe scan ($\phi_F$, $\phi=0$; $\phi_F$, $\phi=\pi/2$; $\phi_F$, $\phi=\pi$; $\phi_F$, $\phi=3\pi/2$)
Figure 24:
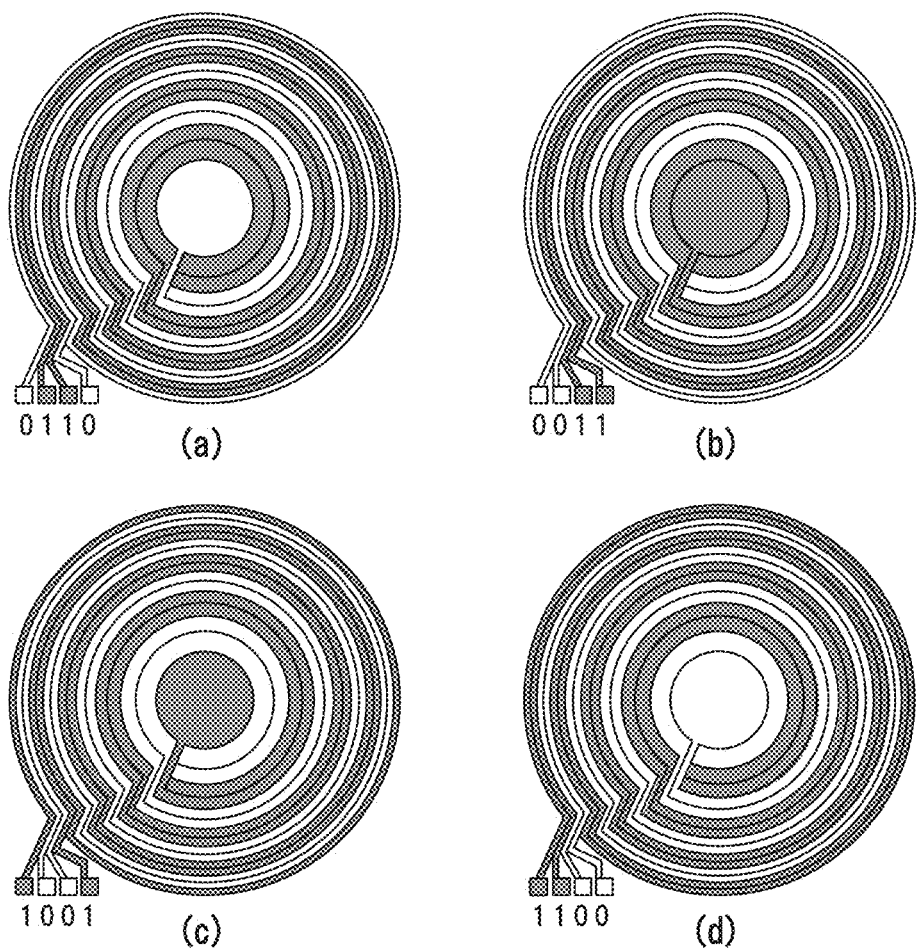
FIG. 24 is a diagram showing examples of modulators in time-division fringe scan ($\phi_F$, $\phi=0$; $\phi_F$, $\phi=\pi/2$; $\phi_F$, $\phi=_F$, $\phi=3\pi/2$)

FIG. 22 shows therein a configuration for achieving time-division fringe scan. A modulator 2201 is, for example, a liquid crystal display element or the like that is capable of electrically switching and displaying the multiple initial phases shown in FIG. 23. The patterns in FIGS. 23(a) to 23(d) each has an initial phase $\Phi_F$ or $\Phi$ of $\{0, \pi/2, \pi, 3\pi/2\}$. FIG. 24 shows therein examples of the electrode arrangement in the liquid crystal display element of the modulator 2201 for achieving the foregoing patterns. Concentric electrodes are configured so as to divide one period of the grating pattern equally into four, and connected every four electrodes from the inner side, and four electrodes are extended as drive terminals from the outer periphery. Switching the conditions of the voltages applied to the four electrodes with time between the two states of "0" and "1" makes it possible to switch the initial phase $\Phi_F$ or $\Phi$ of the grating pattern to $\{0, \pi/2, \pi, 3\pi/2\}$ as in FIG. 23. It is to be noted that in FIG. 24, the shaded electrodes with "1" applied thereto correspond to light shielding, whereas the white electrodes with "0" applied thereto correspond to light transmission.

Figure 25:
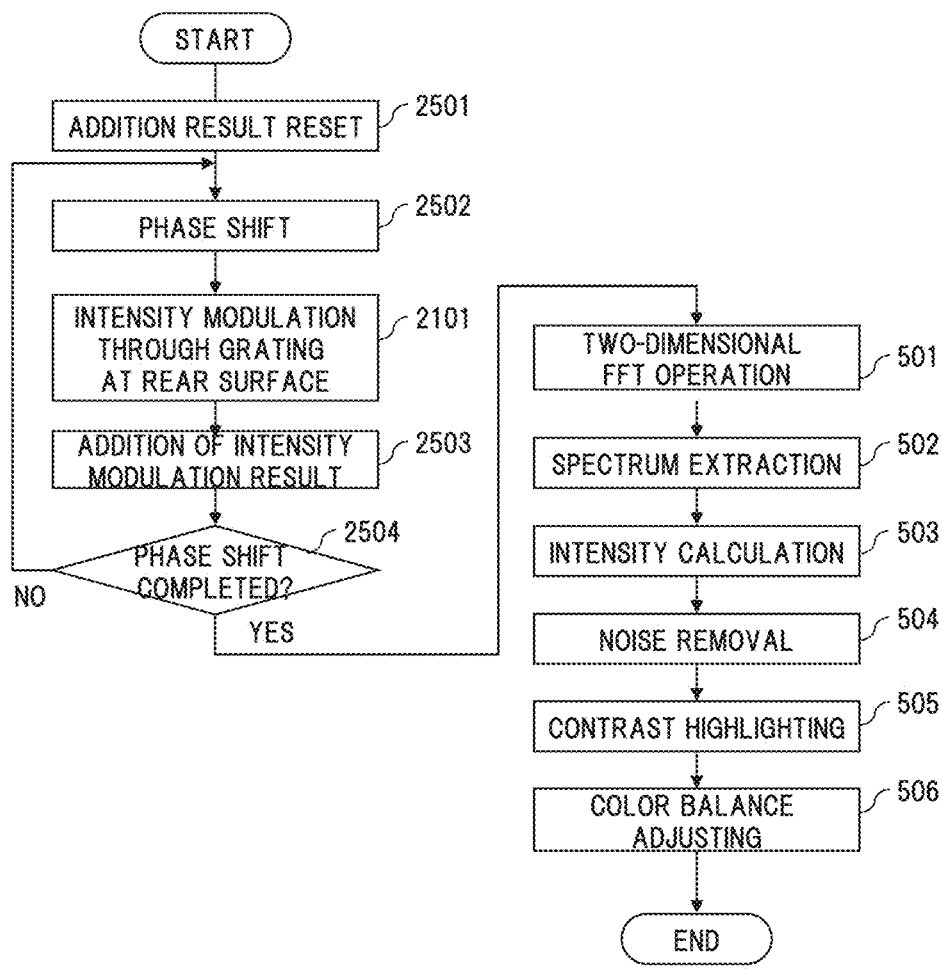
FIG. 25 is a diagram showing an example of a processing flow for time-division fringe scan.

Next, FIG. 25 shows a flowchart showing an overview of image processing in an image processing unit 2203. The difference of the flowchart in FIG. 25 herein from the flowchart in FIG. 21 is processing in steps 2501 to 2504.

First, an addition result is reset at the beginning of a fringe scan operation (2501). Next, in the case of corresponding to the formula 20, the same initial phase as that of the grating pattern 104 used for shooting is set (2502), thereby generating the grating pattern 105 with the initial phase, by which the image of the image sensor 103 is multiplied (2101). This result is added for every pattern of each initial phase (2503). The foregoing processing in the steps 2502 through 2503 is repeated for the number of patterns for all of the initial phases (2504). The subsequent processing is configured in the same fashion as the processing in FIG. 21, and the description thereof will be omitted here. It is to be noted that while the flow mentioned above has been described with reference to the formula 20 as an example, it is possible to apply the flow to the formulas 19, 22, and 23 as well.

Figure 26:
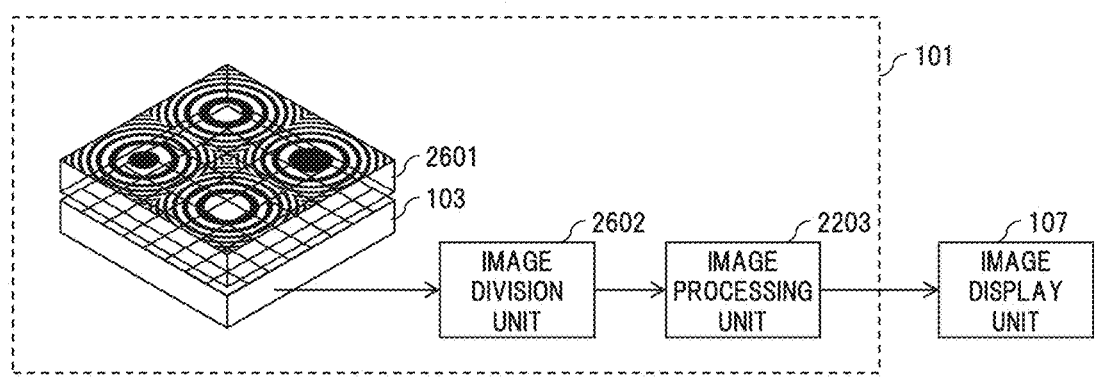
FIG. 26 is a diagram showing a modification example of spatial-division fringe scan.
Figure 27:
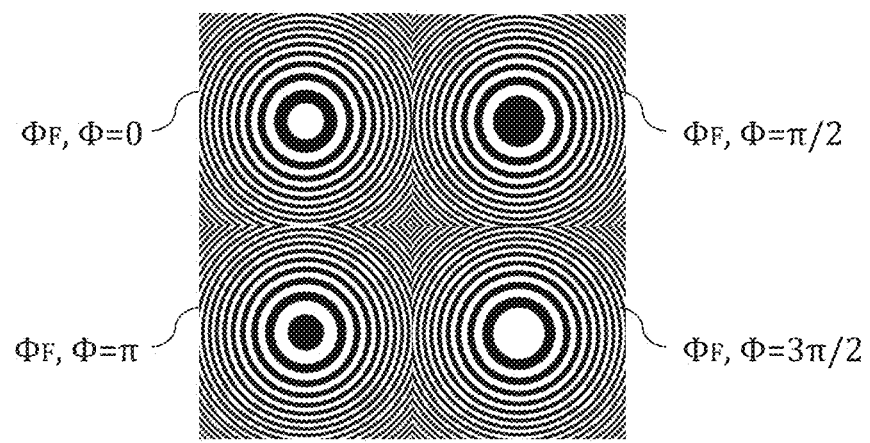
FIG. 27 is a diagram illustrating an example of a grating pattern in spatial-division fringe scan.

In contrast, FIG. 26 shows a configuration for achieving spatial-division fringe scan. A modulator 2601 is configured to have two-dimensionally arranged patterns at multiple initial phases, for example, like patterns that each have an initial phase $\Phi_F$ or $\Phi$ of $\{0, \pi/2, \pi, 3\pi/2\}$ in FIG. 27. An image division unit 2602 divides the output from the image sensor 103 into regions in accordance with the pattern layout of the modulator 2601, and sequentially transmits the divided output to an image processing unit. In the example in FIG. 26, the output of the image sensor is intended to be divided into four regions of 2 vertical×2 horizontal. While the modulator 2601 have the regions of 2 vertical×2 horizontal because the fringe scan based on the formula 20 requires 4 phases, the fringe scan based on the formula 22 can be achieved with two phases, it is thus possible to achieve the modulator 2601 even in accordance with a pattern layout of 1 vertical×2 horizontal regions, and accordingly, the output of the image sensor is also divided into 1 vertical×2 horizontal domains. The subsequent processing in the image processing unit 2203 is configured in the same fashion as the processing in FIG. 22 for time-division fringe scan, and the description thereof will be omitted.

When this spatial-division fringe scan is used, the modulator can be prepared inexpensively, without the need for electrical switching like the modulator 2201 for time-division fringe scan. However, the use of the spatial-division fringe scan substantially decreases the resolution, because the image is divided. Accordingly, the time-division fringe scan is suitable when there is a need to increase the resolution.

Figure 28:
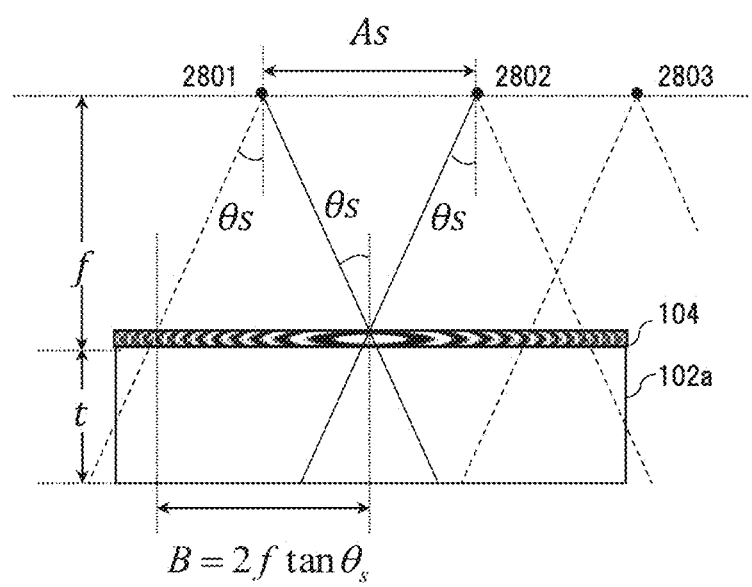
FIG. 28 is a diagram showing the relationship between a grating pattern and a field of view in the case of an object located at close range.

<Problem with Closeup Imaging> Next, a problem with imaging an object at close range will be described. In the case of irradiating an object with light from a certain light source, and imaging the scattered light at close range, the scattered light from the object presents a problem. FIG. 28 is an explanatory diagram illustrating a divergence angle (scattering angle) $\theta_s$ of light from a certain point of an object in the case of the object of imaging located at close range. As shown in FIG. 28, when the first grating pattern 104 is irradiated with scattered light from a point 2801 constituting the object, the diameter B of the irradiated region in the first grating pattern 104 is represented by the following formula with the use of the scattering angle $\theta_s$:

[Mathematical Formula 25]

$$B = 2f \tan \theta_s \quad \text{Formula 25}$$

f represents the distance from the point 2801 to the first grating pattern 104. As just described, only the irradiated region of the first grating pattern 104 can be used during closeup shooting. It is to be noted that while the scattered light intensity is considered to be gradually attenuated with increase in scattering angle in actuality, the scattered light is assumed to reach only the irradiated region in FIG. 28, for the sake of simplification.

The first grating pattern 104 is composed of a concentric grating pattern with a fringe pitch narrowed from the center outwardly, and the fringe pitch in the irradiated region is thus narrowed with increasing distance from the center of the first grating pattern 104, for example, like a point 2803. The projection image of a fringe with a narrow pitch, which undergoes a decrease in contrast on the image sensor 103 due to the influence of diffraction and the like, is thus likely to be buried in noises, and difficult to develop. From the foregoing, while imaging of points around the center of the first grating pattern 104 is possible like the points 2801, 2802, imaging is more difficult with increasing distance from the center like the point 2803, and the imageable range (field of view) will be thus limited.

Experimentally, it has been found that imaging can be achieved when scattered light passes through the center of the first grating pattern 104. Therefore, in the case of $\theta_s \leq \theta_{max}$ with the use of the maximum angle of view $\theta_{max}$ provided by the formula 13, the viewing angle is regarded as the scattering angle $\theta_s$, and the diameter $A_s$ of the field of view is represented as follows:

[Mathematical Formula 26]

$$A_s = 2f \tan \theta_s \quad \text{Formula 26}$$

In order to expand the field of view, there is a method of broadening the fringe pitch by decreasing coefficient β of the concentric grating pattern that forms the first grating pattern 104, but when the pitch is broadened, the resolution will be degraded.

<View Expansion Method in Closeup Imaging> Therefore, a method of expanding the field of view while keeping the resolution in imaging an object at close range will be described.

Figure 29:
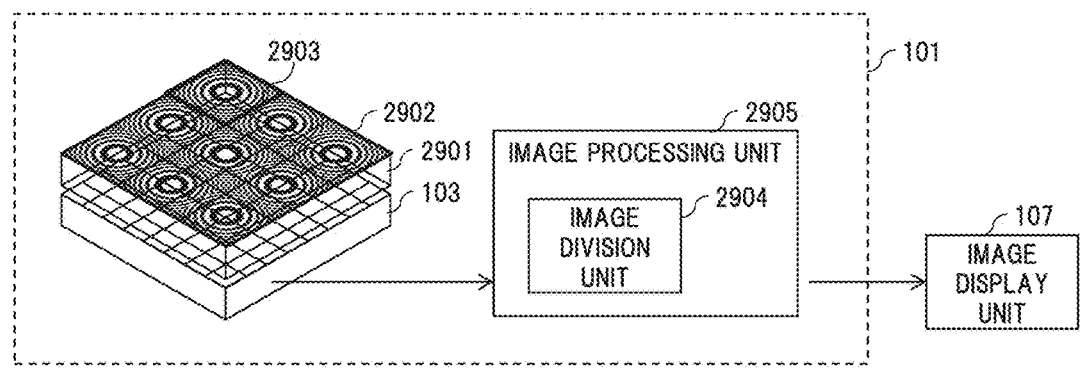
FIG. 29 is a diagram showing a configuration example for view expansion with a pantoscopic grating pattern.
Figure 30:
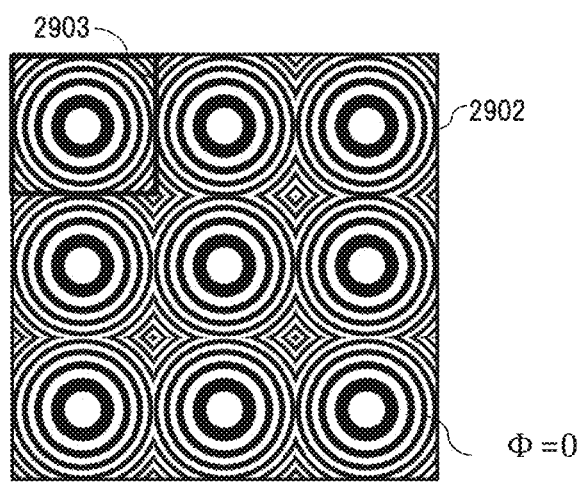
FIG. 30 is a diagram showing an example of a pantoscopic grating pattern.

FIG. 29 is a diagram showing a configuration example for view expansion with a pantoscopic grating pattern. FIG. 29 shows a configuration that is capable of expanding a field of view in closeup imaging. The differences in FIG. 29 from FIG. 19 are to use, as the first grating pattern 104, a first pantoscopic grating pattern 2902 of multiple basic patterns 2903 arranged, and to include an image division unit 2904 and an image processing unit 2905. FIG. 30 shows an example of the first pantoscopic grating pattern 2902. The first pantoscopic grating pattern 2902 can be achieved by arranging, on a plane surface parallel to the imaging element, the 3 vertical×3 horizontal basic patterns 2903 composed of concentric grating patterns without having any overlap. The configuration with multiple basic patterns arranged as just described makes it possible to arrange the field of view $A_s$ of the single grating pattern multiple times. This configuration makes it possible to control the problem of limiting the field of view due to the influence of diffraction and the like on the decrease in resolution, which is made stronger by the excessively narrowed fringe pitch at the periphery of the irradiated region, without changing the coefficient β of the grating pattern.

It is to be noted that the first pantoscopic grating pattern 2902 is described in FIG. 29 as a pattern composed of the 3 vertical×3 horizontal basic patterns arranged, but not to be considered limited thereto, and may be changed appropriately in accordance with the size of an object of shooting, the distance to an object of shooting, or the like.

Figure 31:
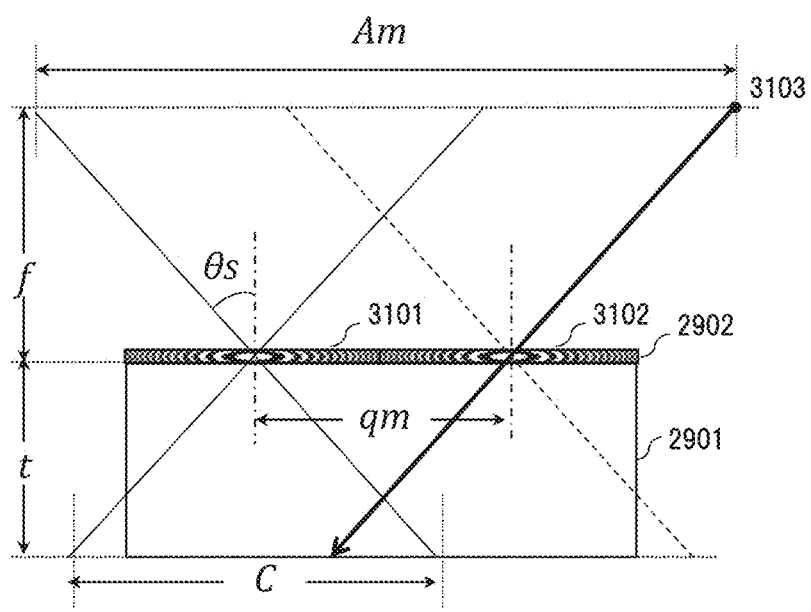
FIG. 31 is a diagram illustrating the principle of crosstalk generation in the case of a pantoscopic grating pattern.

In addition, FIG. 31 shows a field of view with a pantoscopic grating pattern. When the center-to-center distance between concentric circles of adjacent basic patterns and the number of basic patterns arranged are respectively denoted by $q_m$ and n, the field of view $A_m$ with the pantoscopic grating pattern is represented as follows:

[Mathematical Formula 27]

$$A_m = \sum_{m=1}^{n} q_m + 2f \tan \theta_s \quad \text{Formula 27}$$

In addition, the concentric grating patterns constituting the respective basic patterns 2903 may have any initial phase φ. In addition, while the configuration in FIG. 29 uses the single image sensor 103, multiple image sensors 103 may be arranged and used.

<Principle of Crosstalk Generation> The use of the pantoscopic grating pattern can lead to a problem with crosstalk generated from adjacent basic patterns. Crosstalk in imaging with the use of the first pantoscopic grating pattern 2902 will be described with reference to FIG. 31. When the viewing angle of a basic pattern 3101 is denoted by $\theta_s$, on the image sensor 103, scattered light enters in the range with the following diameter:

[Mathematical Formula 28]

$$C = 2t \tan \theta_s \quad \text{Formula 28}$$

This range of information makes a contribution to imaging in the range of the viewing angle $\theta_s$ of the basic pattern 3101.

However, a light beam from, for example, a point 3103 passes through an adjacent basic pattern 3102 and then enters in the range of C. In development of the basic pattern 3101, information on the adjacent basic patterns 3102 causes noises. As just described, crosstalk is generated by light beams that pass through the different basic pattern and then enter.

Example 1

Shape of Modulator

Figure 32:
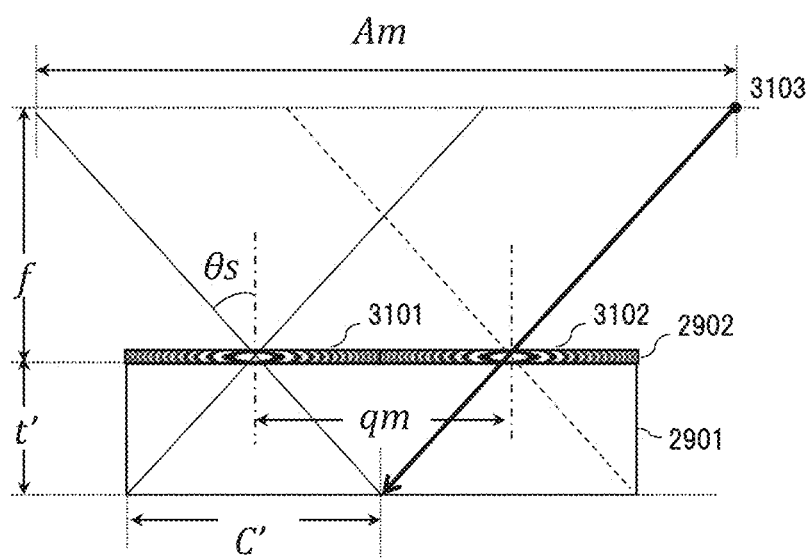
FIG. 32 is a diagram showing an example of a configuration for reducing crosstalk.

In contrast, no crosstalk is generated in the case of $C \leq q_m$ as in FIG. 32. More specifically, the modulator 102 is configured to provide t (the thickness of the modulator 102) and $q_m$ (the center-to-center distance between concentric circles of adjacent basic patterns) that meet $t \leq q_m/(2 \cdot \tan \theta_s)$, thereby making it possible to prevent crosstalk.

Figure 33A:
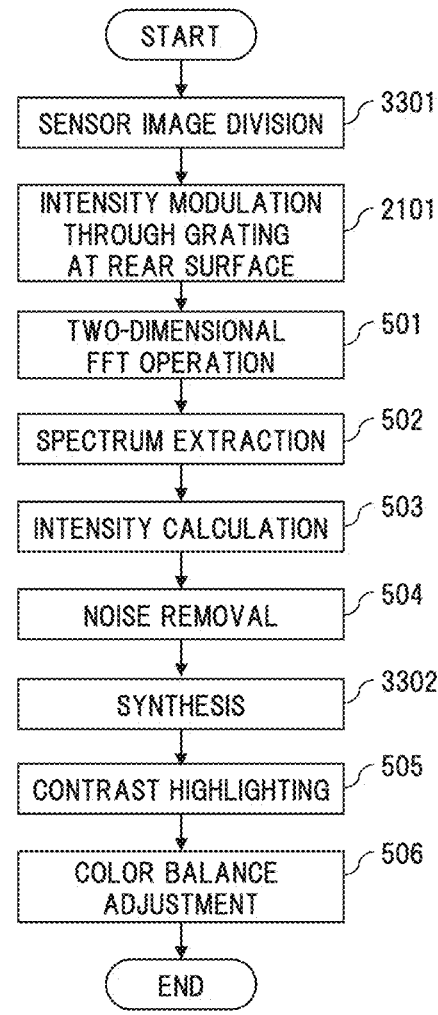
FIGS. 33A and 33B are diagrams showing a processing flow in the case of a pantoscopic grating pattern.
Figure 33B:
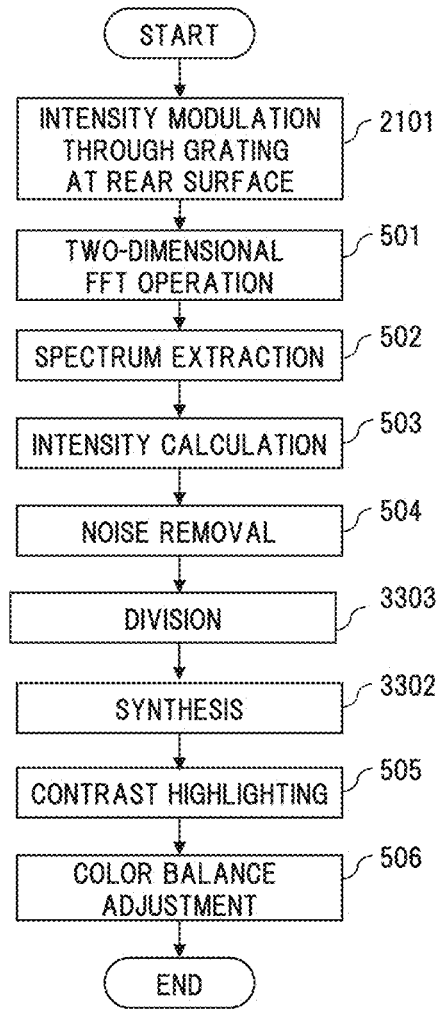

Subsequently, image processing in the case of applying the pantoscopic grating pattern will be described. FIG. 33A and FIG. 33B are flowcharts showing overviews of image processing conducted by the image processing unit 2905. The difference of the flowchart in FIG. 33A from FIG. 21 is processing in a step 3301 and a step 3302.

First, in the image division part 2904, the sensor imagery acquired by the image sensor 103 is divided in accordance with the arrangement of the basic patterns 2903 (3301). Subsequently, the same processing as the processing in FIG. 21 is conducted up to the step 504, and in a step 3302, the output images in the step 504 are sorted and synthesized in accordance with the division in the step 3301. The subsequent processing is configured in the same fashion as the processing in FIG. 21. It is to be noted that the grating pattern at the rear surface for use in the processing in the step 2101 may be either the first grating pattern composed of the single basic pattern 2903, which is monocular, or the same pantoscopic pattern as the first pantoscopic grating pattern 2902 which is pantoscopic.

The difference of the flowchart in FIG. 33B from FIG. 33A is the timing of dividing the output image. According to FIG. 33B, the step 3301 in FIG. 33A is not conducted, but the output image subjected to the processing in the step 504 is divided in accordance with the arrangement of the basic patterns 2903 (3303), and sorted and synthesized (3302).

It is to be noted that while FIG. 29 has been described with reference to FIG. 19, it is also possible to achieve noise cancellation by fringe scan, through the application as well to the other configurations such as in FIG. 22.

The foregoing configuration makes it possible to expand the field of vision with the resolution kept even in closeup imaging.

Example 2

Crosstalk Reduction with Light Shielding Plate

A method of reducing, with a light-shielding plate, crosstalk generated from adjacent basic patterns in the first pantoscopic grating pattern 2902 will be described in the present example.

Figure 34:
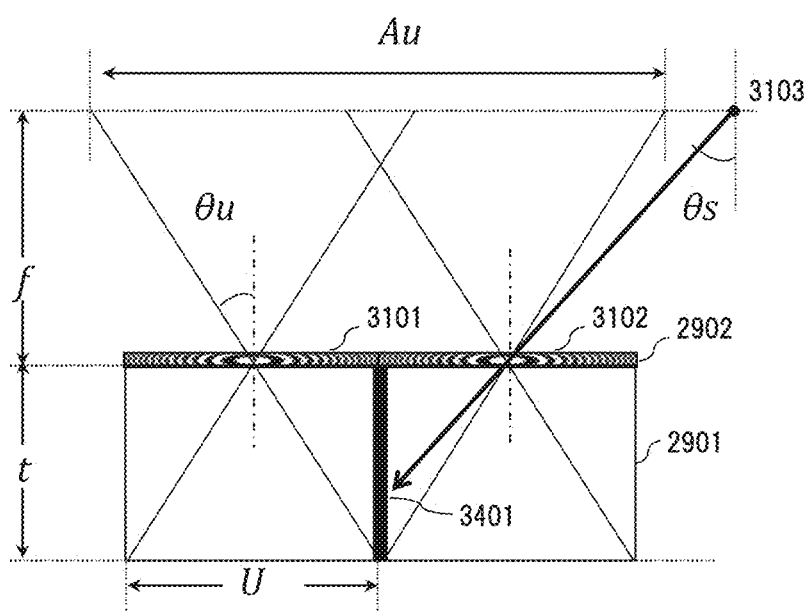
FIG. 34 is a diagram for explaining the principle of crosstalk reduction with a light shielding plate.

As described above, according to Example 1, crosstalk is reduced by properly setting t (the thickness of the modulator 102) and $q_m$ (the center-to-center distance between concentric circles of adjacent basic patterns), which may limit the degree of freedom for modulator design. It is possible to reduce crosstalk also by inserting a light shielding plate. FIG. 34 shows the principle of crosstalk reduction with a light shielding plate. Light beams from the point 3101, which cause noise with respect to imaging with the basic pattern 3103, can be removed by inserting a light shielding plate 3401.

Figure 35:
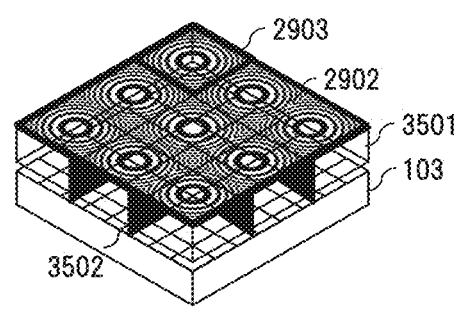
FIG. 35 is a diagram showing a configuration example of a modulator for crosstalk reduction with a light shielding plate.

FIG. 35 is an explanatory diagram of a configuration for achieving crosstalk reduction with a light shielding plate. In FIG. 35, a light shielding plate 3502 is inserted into a modulator 3501. There is a need for the light shielding plate to be composed of a material that is not transparent to a wavelength intended for shooting, for which a black plastic plate or a metal plate may be used in the case of visible light, whereas an acrylic plate or a metal plate may be used in the case of far-infrared light. In addition, the light shielding plate 3502 is disposed so as to separate regions U with the basic patter 2903 as a unit from each other as shown in FIG. 34. In this case, the viewing angle corresponds to $\theta_{max}$, obtained when S=U is satisfied in the formula 13, the field of view $A_u$ is represented as follows when the viewing angle is denoted by $\theta_u$:

[Mathematical Formula 29]

$$A_u = \sum_{m=1}^{n} q_m + 2f\tan\theta_u \quad \text{Formula 29}$$

The foregoing configuration makes it possible reduce crosstalk generated from adjacent basic patterns in the first pantoscopic grating pattern, without limiting the degree of freedom for design.

Example 3

Crosstalk Reduction with Polarization Plate

A method of reducing, with polarization plates, crosstalk generated from adjacent basic patterns in the first pantoscopic grating pattern will be described in the present example.

Figure 36:
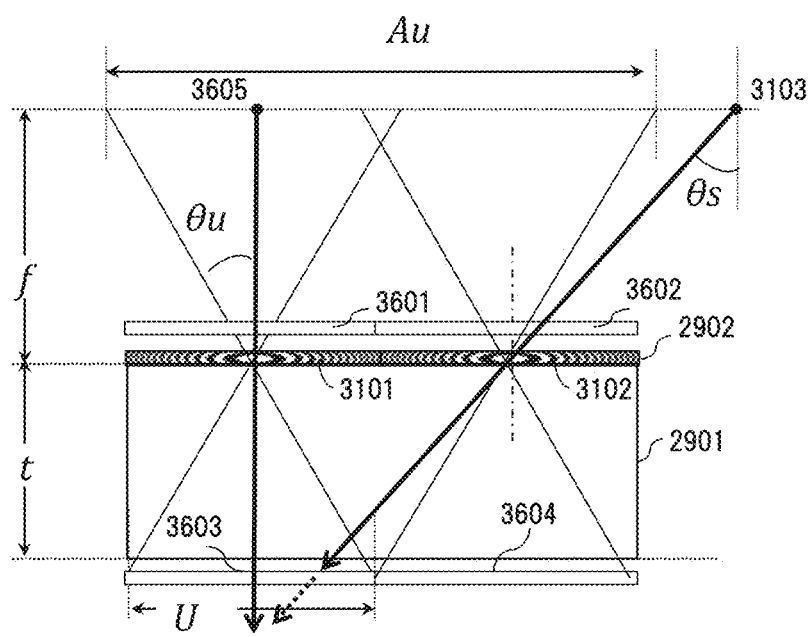
FIG. 36 is a diagram for explaining the principle of crosstalk reduction with polarization plates.

FIG. 36 shows the principle of crosstalk reduction with polarization plates. The modulator 2901 is configured to be sandwiched by polarization plates 3601 to 3604. In addition, the polarization plates are arranged such that adjacent polarization plates have polarizing axes orthogonal to each other like the polarization plates 3601 and 3602, and opposed polarization plates have polarizing axes aligned with each other like the polarization plates 3601 and 3603. Thus, light beams from a point 3605 of imaging with the basic pattern 3101 go through the polarization plates 3601 and 3603, and the light reaches the image sensor 103 because the polarizing axes of the two polarization plates are parallel to each other. In contrast, light beams from the point 3103, which cause noise, go through the polarization plates 3602 and 3603, but the light fails to reach the image sensor 103 because the polarizing axes of the two polarization plates are orthogonal to each other. Therefore, crosstalk can be removed. In this case, the viewing angle corresponds to $\theta_u$, and the field of view $A_u$ is given by the formula 29.

Figure 37A:
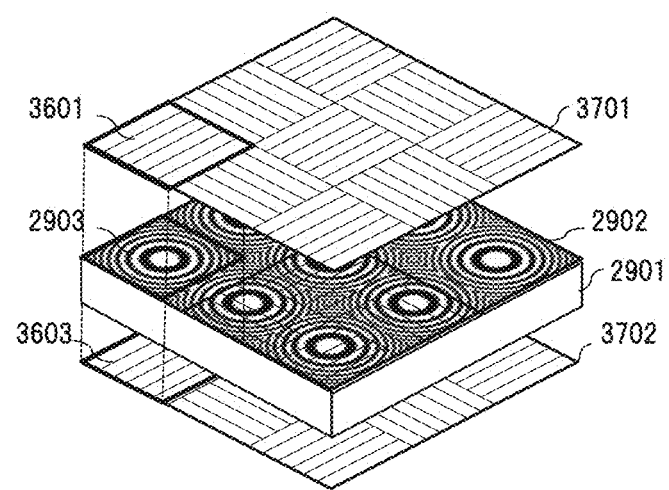
FIGS. 37A and 37B are diagrams showing a configuration example of a modulator for crosstalk reduction with the polarization plates.
Figure 37B:
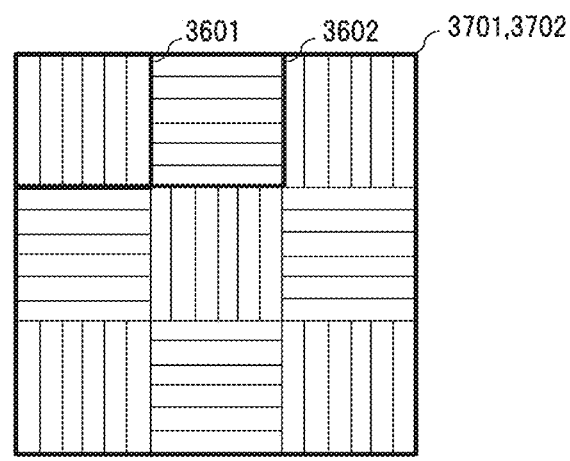

FIGS. 37A and 37B are explanatory diagrams of a configuration for achieving crosstalk reduction with polarization plates. As shown in FIG. 37A, the configuration is adapted to sandwich the modulator 2901 between a first polarization plate 3701 and a second polarization plate 3702. The first polarization plate 3701 is disposed close to the first pantoscopic grating pattern 2902, and the second grating pattern is disposed close to the image sensor 103. It is to be noted that the first polarization plate 3701 is disposed closer to the surface of the modulator 2901 in FIG. 37A, but may be disposed closer to the rear surface of the first pantoscopic grating pattern 2902.

FIG. 37B shows an examples of the polarization plates 3701, 3702. The polarization plate 3701 is composed of multiple polarization plates, which are disposed such that adjacent polarization plates have polarizing axes orthogonal to each other, like the polarization plate 3601 and the polarization plate 3602. In addition, the polarization plate 3601 is adapted to have the same size as the basic pattern 2903 of the first pantoscopic grating pattern 2902, and disposed in accordance with the arrangement of the basic patterns 2903.

The foregoing configuration makes it possible to reduce crosstalk generated from adjacent basic patterns in the first pantoscopic grating pattern.

It is to be noted that the first pantoscopic grating pattern 2902 is adapted to have a pattern composed of the 3 vertical×3 horizontal basic patterns arranged in FIGS. 37A and 37B, but not to be considered limited thereto, and may be changed appropriately in accordance with the size of an object of shooting, the distance to the object of shooting, or the like.

In addition, in the case of achieving the first pantoscopic grating pattern with the use of a liquid crystal display element, a polarization plate of the liquid crystal display element can be adopted as the polarization plate 3603 constituting the first polarization plate 3701 mentioned above.

In addition, the polarization plates are disposed so as to align the polarizing axes of the opposed polarization plates like the polarization plates 3601 and 3603, but not to be considered limited thereto, and the tilts of the polarizing axes may be set so as to maximize the amount of light passing through the opposed polarization plates, or minimize the amount of crosstalk light, because the polarization planes may turn depending on the material of the modulator 2901.

Example 4

Crosstalk Cancellation

A method of cancelling, in accordance with fringe scan, crosstalk generated from adjacent basic patterns in the first pantoscopic grating pattern will be described in the present example.

In the crosstalk cancellation by fringe scan, there is a need to use, at least as the first pantoscopic grating pattern, a pattern with multiple basic patterns that differ in initial phase. In order to achieve the multiple basic patterns, there are: a method of using time-division fringe scan and a method of using spatial-division fringe scan.

Figure 38:
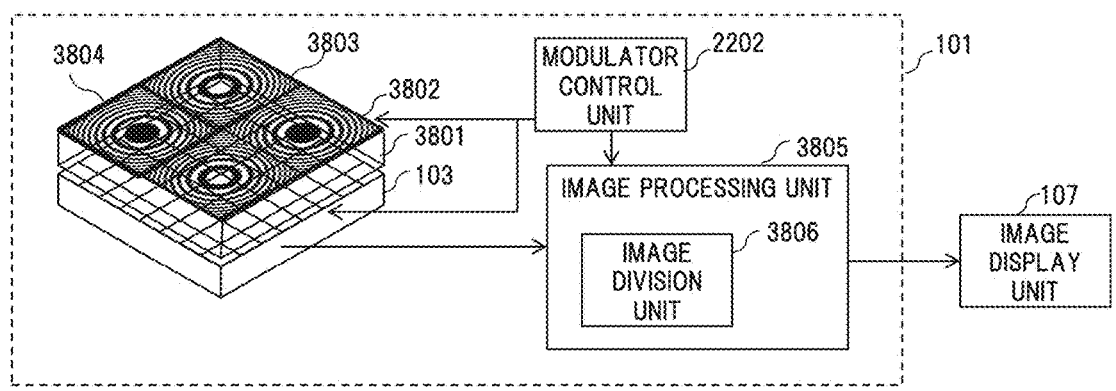
FIG. 38 is a diagram showing a configuration example for crosstalk cancellation by time-division fringe scan.

First, crosstalk cancellation with the use of time-division fringe scan will be described. FIG. 38 shows therein a configuration for achieving crosstalk cancellation with the use of time-division fringe scan. The difference in FIG. 38 from FIG. 22 is to use a first pantoscopic grating pattern 3802 as the first grating pattern, and to include an image division unit 3806 and image processing unit 3805. The first pantoscopic grating pattern 3802 is disposed such that a grid of adjacent basic patterns 3803, 3804 has initial phases Φ shifted mutually by π/2.

Figure 39:
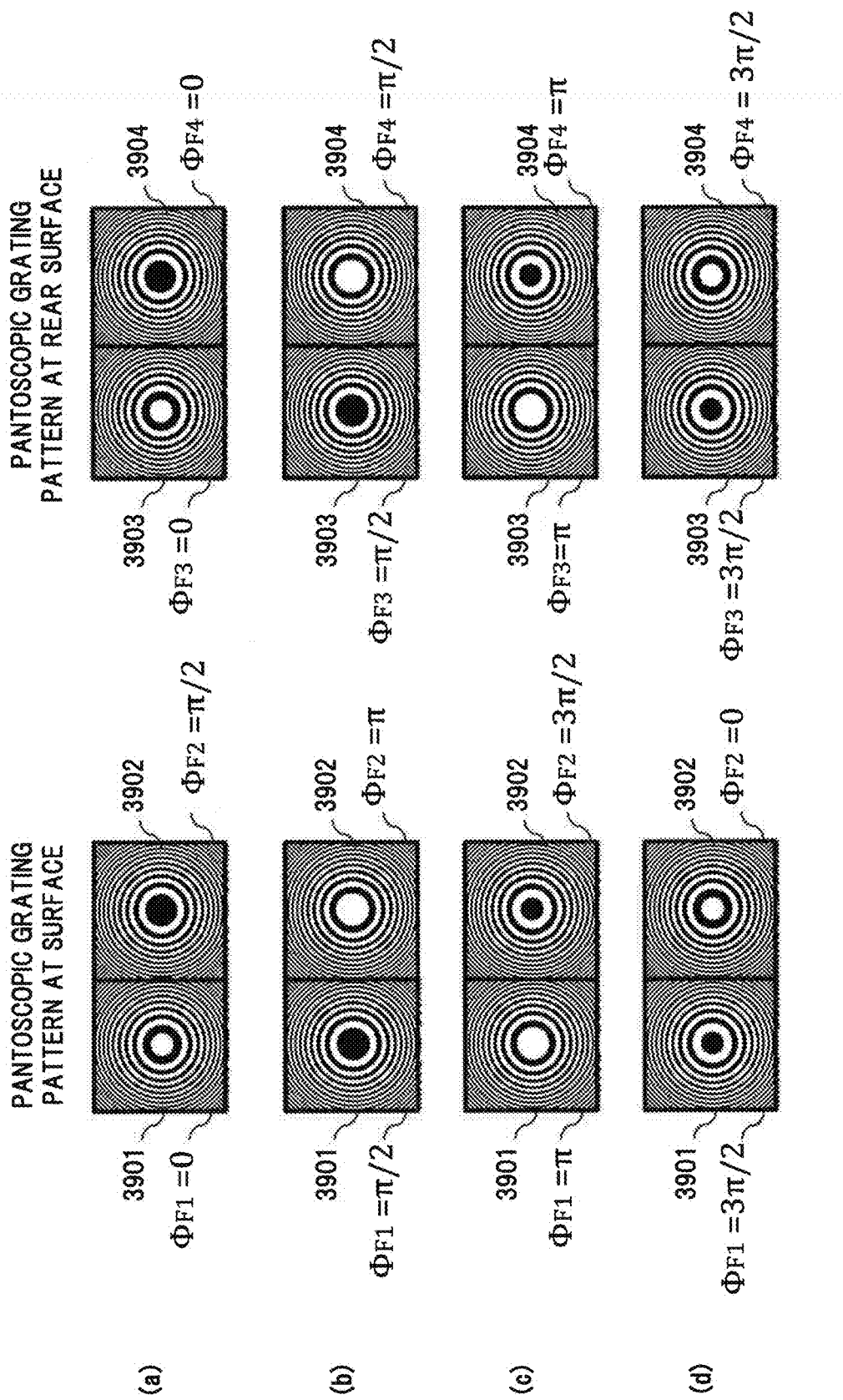
FIG. 39 is a diagram illustrating combinations of grating patterns at a surface and a rear surface for achieving crosstalk cancellation ($\phi_F=0, \pi/2$; $\phi_F=7\pi/2, \pi$; $\phi_F=\pi, 3\pi/2$; $\phi_F=3\pi/2, 0$)

In this regard, the principle of crosstalk cancellation with an initial phase difference of π/2 will be described. FIG. 39 shows therein combinations of the basic patterns 3803, 3804 in FIG. 38. In FIG. 39, the basic patterns 3803, 3804 are respectively referred to as basic patterns 3901, 3902. The basic patterns 3901, 3902 have a combination of initial phases $\Phi_{F1}$ and $\Phi_{F2}$ such as $\{0, \pi/2\}$, $\{\pi/2, \pi\}$, $\{\pi/, 3\pi/2\}$, and $\{3\pi/2, 2\pi\}$, such that the phase difference is π/2 between the respective initial phases $\Phi_{F1}$ and $\Phi_{F2}$. In addition, the initial phases $\Phi_{B1}$ and $\Phi_{B2}$ of basic patterns 3903, 3904 constituting a pantoscopic grating pattern at the rear surface have a combination as well, such as $\{0, \pi/2\}$, $\{/2, \pi\}$, $\{\pi/, 3\pi/2\}$, and $\{3\pi/2, 2\pi\}$, such that the phase difference is π/2 between the initial phases $\Phi_{B1}$ and $\Phi_{B2}$. With this combination, crosstalk can be cancelled when the fringe scan operation is performed in accordance with the formula 19.

For example, a projection image of the basic pattern 3903 is subjected to development processing with the basic pattern 3903, and this pattern has an initial phase difference $(\Phi_{F1}-\Phi_{F3})$ of 0, which results in the cosine term of 1 in the formula 19. In contrast, when an image of the basic pattern 3902, which causes crosstalk, is subjected to development processing with the basic pattern 3903, the initial phase difference $(\Phi_{F1}-\Phi_{F3})$ of π/2 results in the cosine term of 0 in the formula 19, which means cancellation. Accordingly, the combination of the initial phases of the pantoscopic grating pattern at the surface and of the pantoscopic grating pattern at the rear surface allows crosstalk cancellation.

Figure 40:
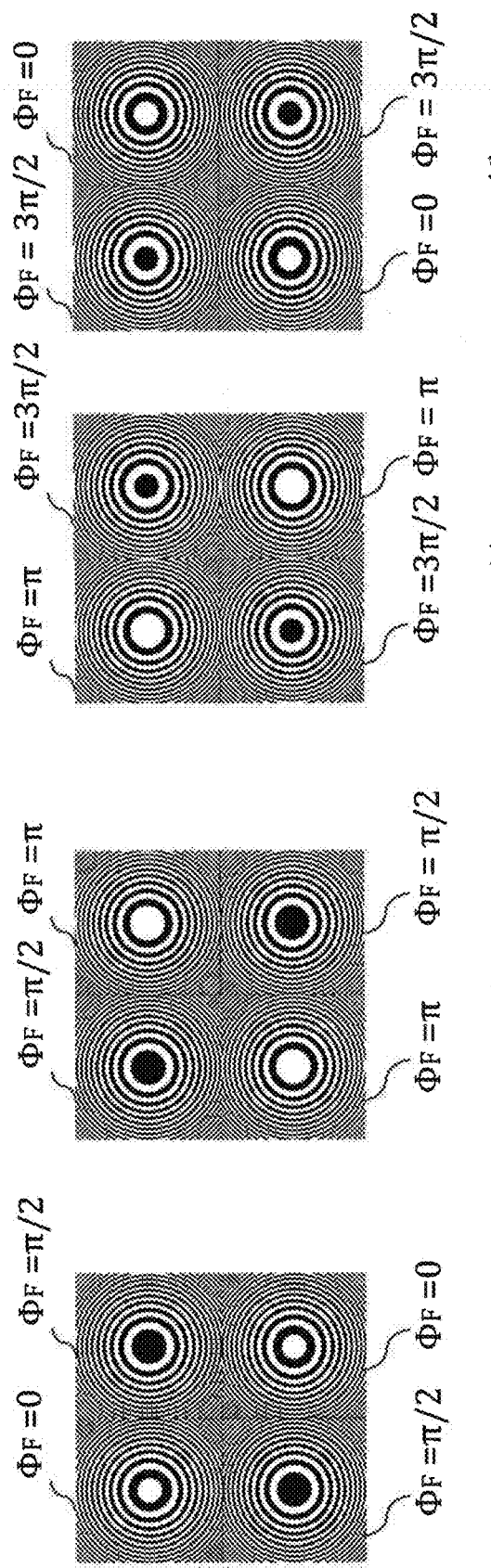
FIG. 40 is a diagram showing examples of grating patterns for crosstalk cancellation in time-division fringe scan ($\phi_F=0, \pi/2$; $\phi_F=\pi/2, \pi$; $\phi_F=\pi, 3\pi/2$; $\phi_F=3\pi/2, 0$)

FIG. 40 shows examples of the first pantoscopic grating pattern 3802. As shown in FIG. 40, the first pantoscopic grating pattern 3802 is used while switching the basic patterns 3803, 3804 that differ in initial phase. The switching method is configured in the same fashion as the method for time-division fringe scan, described in Example 1, and the description thereof will be omitted.

Figure 41:
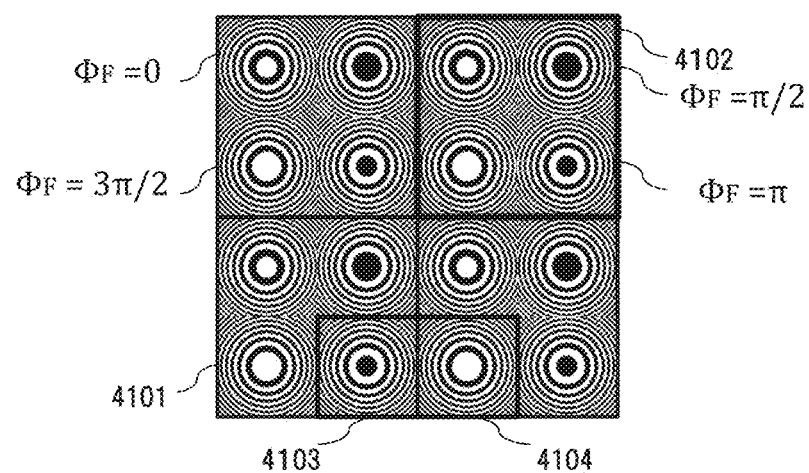
FIG. 41 is a diagram showing an example of a grating pattern for achieving crosstalk cancellation in spatial-division fringe scan.

Next, crosstalk cancellation with the use of spatial-division fringe scan will be described. FIG. 41 shows an example of the first pantoscopic grating pattern. The first pantoscopic grating pattern 4101 has basic patterns 4102 each composed of divided patterns 4103, 4104 with four initial phases, in order to achieve spatial-division fringe scan. Furthermore, in order to achieve crosstalk cancellation, the grating pattern is disposed such that a grid of adjacent divided patterns has initial phases shifted by π/2, like the divided pattern 4103 and the adjacent divided pattern 4104. With this combination, performing the fringe scan operation in accordance with the formula 19 makes it possible to cancel crosstalk as described previously.

The foregoing configuration makes it possible to reduce crosstalk generated from adjacent basic patterns in the first pantoscopic grating pattern.

It is to be noted that while the basic patterns constituting the first pantoscopic grating pattern are arranged such that the adjacent basic patterns have no overlap therebetween according to Examples 1 to 3, the adjacent basis patterns may have an overlap therebetween according to the present example.

Example 5

Use of Crosstalk Cancellation in Combination with Polarization Plate

In the present example, a method of reducing crosstalk generated from adjacent patterns in the first pantoscopic grating pattern will be described, where the crosstalk cancellation according to Example 4 is used in combination with the method of reducing crosstalk with polarization plates according to Example 3.

In accordance with the crosstalk cancellation method according to Example 4, the influence of crosstalk is cancelled by disposing the grating pattern such that a grid of adjacent basic patterns has initial phases Φ shifted mutually by π/2. However, this method may fail to fully cancel crosstalk from diagonally adjacent basic patterns in some cases. Therefore, an example of using polarization plates in combination will be given in Example 5.

Figure 42:
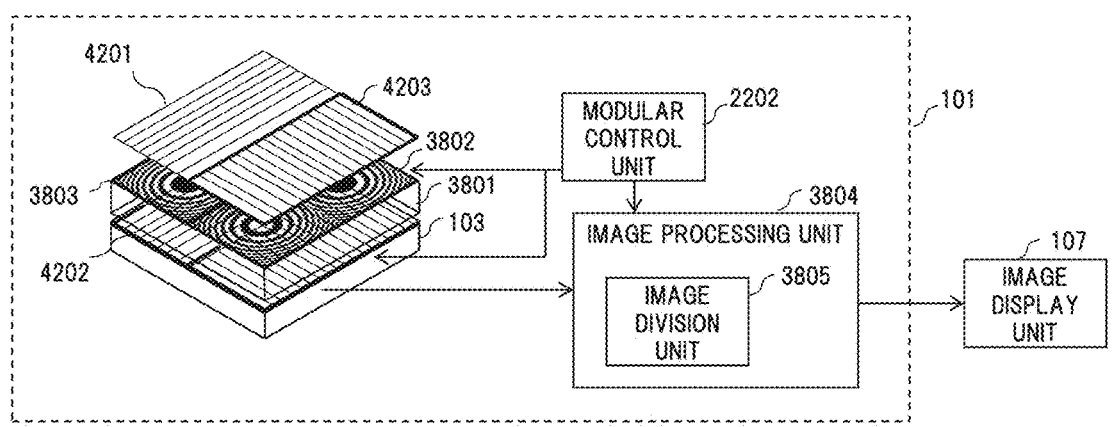
FIG. 42 is a diagram showing an example of a configuration for achieving crosstalk reduction with the use of crosstalk cancellation in combination with a polarization plate.

FIG. 42 is an explanatory diagram illustrating a method of reducing crosstalk by the use of crosstalk cancellation with the use of time-division fringe scan in combination with polarization plates. The difference in FIG. 42 from FIG. 38 is to include two polarization plates of a first polarization plate 4201 and a second polarization plate 4202. The first polarization plate 4201 is disposed close to the first pantoscopic grating pattern 3802, whereas the second polarization plate 4202 is disposed close to the image sensor 103. In this regard, the second polarization plate 4202 is considered equivalent to the first polarization plate 4201, and disposed so as to align the polarizing directions of the polarization plates. It is to be noted that the first polarization plate 4201 is disposed closer to the surface of the modulator 3801 in FIG. 42, but may be disposed closer to the rear surface of the first pantoscopic grating pattern 3802.

Figure 43:
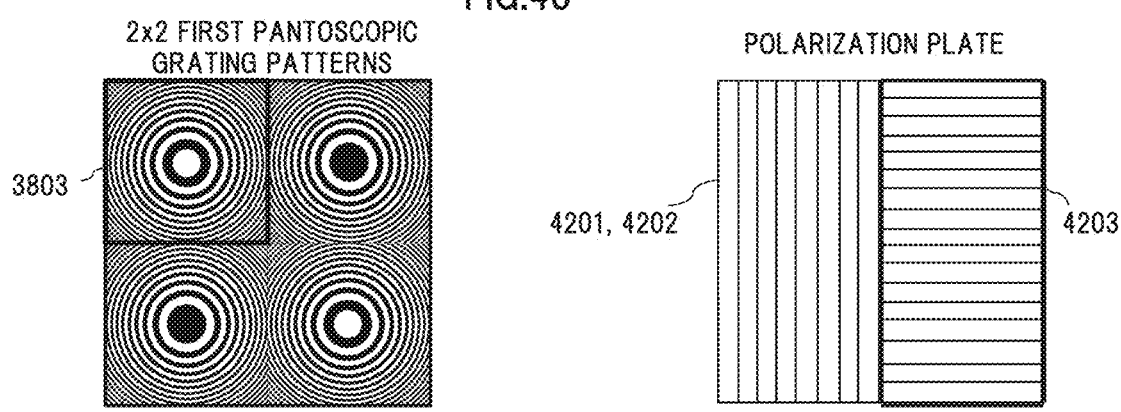
FIG. 43 is a diagram showing an example of a polarization plate for achieving crosstalk reduction with the use of crosstalk cancellation in combination with the polarization plate.

FIG. 43 shows an example of the polarization plates 4201 and 4202. The difference in FIG. 43 from the polarization plates 3701 and 3702 described with reference to FIG. 37 is that the size of a polarization plate 4203 constituting the first polarization plate 4201 and the second polarization plate 4202 is the size of a row of basic patterns 3803 arranged. In FIG. 43, as an example, the pattern composed of 2 vertical×2 horizontal basic patterns is adopted as the first pantoscopic grating pattern 3802, and the polarization plates 4201, 4202 thus each have a size corresponding to 2 vertical×1 horizontal basic patterns. In addition, the polarizing axes of the adjacent polarization plates 4203 are made orthogonal to the polarizing axes of the polarization plates 4201, 4202. The orthogonal polarizing axes reduce crosstalk.

It is to be noted that the configuration with basic patterns arranged in a grid form has been described as an example, without any limitation thereto, but basic patterns may be arranged such that adjacent basic patterns have a positional relation of 60 degrees with each other, like a honeycomb structure. Even in such a case, the initial phase difference of π/2 between the adjacent basic patterns, or the arrangement of polarization plates adjacent to each other with the polarizing axes thereof orthogonal makes it possible to reduce crosstalk.

The foregoing configuration makes it possible to reduce even crosstalk generated from diagonally adjacent basic patterns in the first pantoscopic grating pattern.

It is to be noted that in the case of achieving the first pantoscopic grating pattern with the use of a liquid crystal display element, a polarization plate of the liquid crystal display element can be adopted as the polarization plate 4203 constituting the first polarization plate 4201 mentioned above.

In addition, the reduction of crosstalk through the use of crosstalk cancellation with the use of spatial-division fringe scan in combination with polarization plates can be also achieved with the use of the two polarization plates 4201 and 4202 mentioned above.

Example 6

Example of Application to Vein Imaging

A finger vein imaging method for application to a finger vein authentication device will be represented in the present embodiment.

Figure 44:
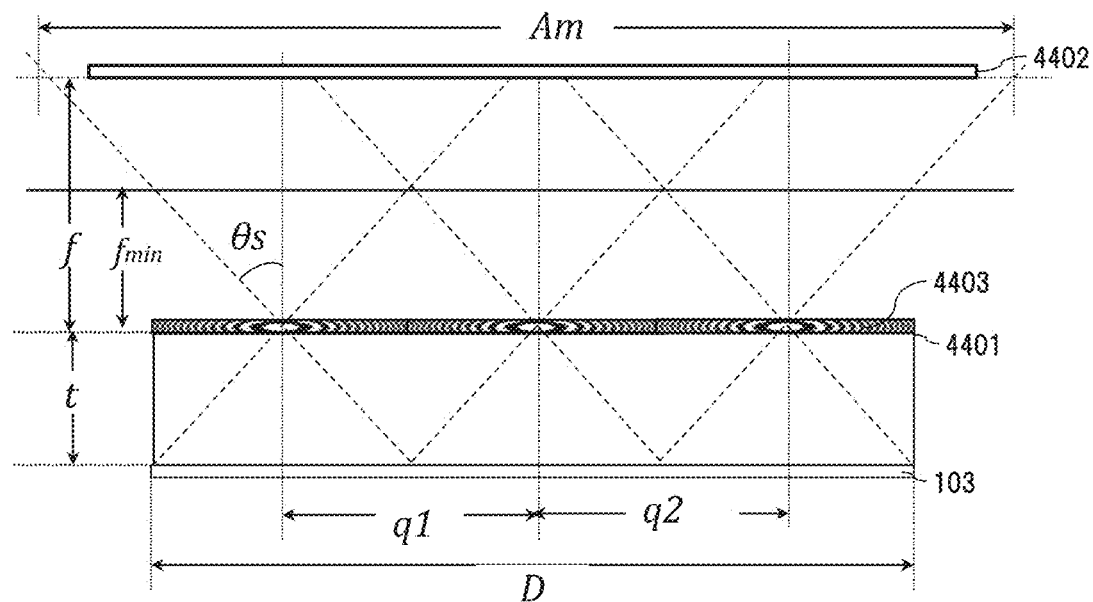
FIG. 44 is a diagram showing an example of a field of view in the case of imaging an object at close range with the use of a pantoscopic grating pattern.

In the case of finger vein authentication, imaging in an adequate field of view is required for the authentication. FIG. 44 is an explanatory diagram illustrating the configuration and optical path of an imaging device for ensuring an adequate field of view for finger vein authentication. $q_m$, n, and f respectively represent the center-to-center distance between basic patterns constituting a first pantoscopic grating pattern 4401, the number of basic patterns in a direction, and the distance from a subject 4402 to the first pantoscopic grating pattern 4401. In this regard, the relationship between the distance f and the center-to-center distance $q_m$ will be described, which is required for obtaining the field of view $A_m$ required for imaging of the subject 4402.

When the distance f is short, the field of view for each basic pattern will be reduced, thereby generating gaps in the synthesized field of view $A_m$. In order to prevent the generation of gaps, f has to be equal to or longer than $f_{min}$ in FIG. 44. The field of view $A_s$ for each basic pattern is represented by the formula 26. The scattering angle $\theta_s$ in the formula 26 corresponds to the scattering angle of transmitted light or reflected light generated when a finger is irradiated with a light source, and thus $A_s = 2f \cdot \tan\theta_s \geq q_m$ has only to be satisfied. More specifically, the distance $f_{min}$ as the limit of bringing the finger close to the first pantoscopic grating pattern is represented by the following formula 30:

[Mathematical Formula 30]

$$f_{min} = \frac{q}{2\tan\theta_s} \qquad \text{Formula 30}$$

Next, the size D of the image sensor 103 will be described, which is required for obtaining the field of view $A_m$. Light beams in the field of view for each basic pattern 4403 are adapted to have the relationship of the formula 27 on the image sensor 103. Therefore, as long as the image sensor has the following size:

[Mathematical Formula 31]

$$D = \sum_{m=1}^{n} q_m + 2\iota\tan\theta_s \qquad \text{Formula 31}$$

it becomes possible to achieve proper imaging of information in the field of view $A_m$.

It is to be noted that the image sensor 103 is not necessarily a single sensor, but it is also possible to increase the sensor size by arranging multiple sensors.

As long as the foregoing requirements are met, the field of view required for finger vein authentication can be acquired. In addition, while the foregoing method causes crosstalk, the use of the crosstalk reduction method described previously makes it possible to reduce the crosstalk.

Figure 45:
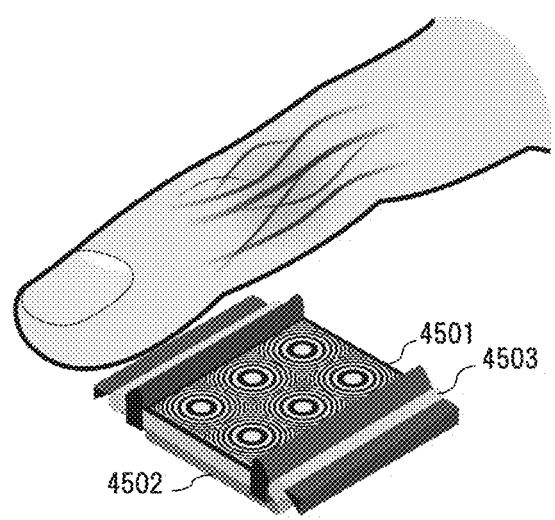
FIG. 45 is a diagram showing an example of using finger vein imaging with the use of a pantoscopic grating pattern.

Subsequently, FIG. 45 shows an example of a finger vein authentication device 45 includes a pantoscopic grating pattern (at the surface) 4501, a light source 4503, and an image sensor 4502. The light source 4503, which uses near-infrared light around a wavelength of 850 nm, is configured such that the image sensor 4502 acquires reflected light from a finger. It is to be noted that a light source may be disposed such that the image sensor 4502 acquires transmitted light. This device can achieve finger vein imaging.

The foregoing configuration makes it possible to ensure a field of view required for finger vein authentication, and achieve a thin finger vein authentication device.

It is to be noted that the present invention described above is not to be considered limited to the examples mentioned above, but considered to encompass various modification examples. For example, the examples mentioned above have been described in detail for clearly explaining the present invention, but are not necessarily to be considered limited to the inclusion of all of the configurations described.

In addition, it is possible to replace a part of a configuration according to an example with a configuration according to another embodiment. In addition, it is also possible to add a configuration according to an example to a configuration according to another embodiment. In addition, it is possible to add/remove/substitute another configuration to/from/for apart of the configuration according to each example. In addition, the respective configurations, functions, processing units, processing means, etc. mentioned above may be partially or entirely achieved with hardware, for example, by designing with integrated circuits. In addition, the respective configurations, functions, etc. mentioned above may be achieved with software in a way that a processor interprets and executes programs for achieving the respective functions. Information such as programs, tables, and files for achieving the respective functions can be stored on recording devices such as memories, hard disks, SSD (Solid State Drive), or recording media such as IC cards, SD cards, and DVDs, and for the execution, readout on a RAM (Random Access Memory) or the like, and executed by a CPU (Central Processing Unit) or the like.

In addition, the control lines and information lines are shown which are considered required for the sake of explanation, but all of the control lines and information lines required for a product are not always shown. In fact, it is conceivable that almost all of the configurations are interconnected.

In addition, the respective configurations, functions, processing units, etc. mentioned above may be partially or entirely achieved with a distribution system, for example, by execution in another device and integrated processing through a network.

In addition, the technical elements according to the embodiment may be applied by itself, or adapted to be applied in multiple separated parts, such as a program part and a hardware part.

The present invention has been described above mainly with reference to the embodiment.

What is claimed is:

1. An imaging device comprising:
a modulator with a first pantoscopic grating pattern, the modulator configured to modulate light intensity by passage through the first pantoscopic grating pattern;
an image sensor configured to convert light passing through the modulator, to image data, and output the image data; and
an image processor configured to conduct image processing of restoring an image with the use of the image data output from the image sensor,
wherein the first pantoscopic grating pattern is configured to comprise multiple basic patterns, and
each of the basic patterns has the shape of a concentric circle, and
wherein the modulator comprises a first polarization plate and a second polarization plate,
the first polarization plate is disposed closer to a surface configured to serve as an input face of the modulator,
the second polarization plate is disposed closer to a rear surface configured to serve as an output face of the modulator, and
the first polarization plate and the second polarization plate have polarizing axes determined on the basis of an arrangement of the basic patterns.

2. The imaging device according to claim 1, wherein at least two or more basic patterns consisting the multiple basic patterns are identical.

3. The imaging device according to claim 1, wherein a light shielding plate is provided between the first pantoscopic grating pattern and the image sensor, and
the light shielding plate is disposed on the basis of an arrangement of the basic patterns.

4. The imaging device according to claim 1, wherein the first polarization plate and the second polarization plate are disposed such that polarizing axes of adjacent polarization plates are orthogonal to each other.

5. An imaging device comprising:
a modulator with a first pantoscopic grating pattern, the modulator configured to modulate light intensity by passage through the first pantoscopic grating pattern;
an image sensor configured to convert light passing through the modulator, to image data, and output the image data; and
an image processor configured to conduct image processing of restoring an image with the use of the image data output from the image sensor,
wherein the first pantoscopic grating pattern is configured to comprise multiple basic patterns, and
each of the basic patterns has the shape of a concentric circle, and
wherein the concentric circles of adjacent ones of the multiple basic patterns differ by $\pi/2$ in initial phase from each other.

6. The imaging device according to claim 1, wherein the modulator comprises a first polarization plate and a second polarization plate,
the first polarization plate is disposed closer to a surface configured to serve as an input face of the modulator,
the second polarization plate is disposed closer to a rear surface configured to serve as an output face of the modulator,
the first polarization plate and the second polarization plate have polarizing axes determined on the basis of an arrangement of the basic patterns, and
the concentric circles of the adjacent basic patterns differ by $\pi/2$ in initial phase from each other.

7. An imaging device comprising:
a modulator with a first pantoscopic grating pattern, the modulator configured to modulate light intensity by passage through the first pantoscopic grating pattern;
an image sensor configured to convert light passing through the modulator, to image data, and output the image data; and
an image processor configured to conduct image processing of restoring an image with the use of the image data output from the image sensor,
wherein the first pantoscopic grating pattern is configured to comprise multiple basic patterns, and
each of the basic patterns has the shape of a concentric circle, and
wherein for each of the concentric circles in the basic patterns, with respect to a reference coordinate as a center of the concentric circle, the concentric circle has a pitch narrowed in inverse proportion to a distance from the reference coordinate.

8. The imaging device according to claim 1, wherein the image processor generates a moire fringe image by modulating the image data with the use of data representing a second pantoscopic grating pattern comprising a concentric circle.

9. The imaging device according to claim 1, wherein the image processor generates a moire fringe image by modulating the image data with the use of data representing a second pantoscopic grating pattern comprising a concentric circle, and calculates a frequency spectrum by applying Fourier transform to the moire fringe image.

* * * * *